US008150066B2

(12) United States Patent
Kubo

(10) Patent No.: US 8,150,066 B2
(45) Date of Patent: Apr. 3, 2012

(54) SOUND SIGNAL PROCESSING DEVICE, SOUND SIGNAL PROCESSING METHOD, SOUND SIGNAL PROCESSING PROGRAM, STORAGE MEDIUM, AND DISPLAY DEVICE

(75) Inventor: Katsutoshi Kubo, Yaita (JP)

(73) Assignee: Sharp Kabushiki Kaisha, Osaka (JP)

( * ) Notice: Subject to any disclaimer, the term of this patent is extended or adjusted under 35 U.S.C. 154(b) by 1160 days.

(21) Appl. No.: 11/947,633

(22) Filed: Nov. 29, 2007

(65) Prior Publication Data

US 2009/0041265 A1 Feb. 12, 2009

(30) Foreign Application Priority Data

Aug. 6, 2007 (JP) ................................ 2007-204755

(51) Int. Cl.
*H03G 5/00* (2006.01)

(52) U.S. Cl. ................................ 381/98; 381/97; 381/58

(58) Field of Classification Search .............. 381/97–98, 381/58

See application file for complete search history.

(56) References Cited

U.S. PATENT DOCUMENTS

| | | | | |
|---|---|---|---|---|
| 3,897,591 | A * | 7/1975 | Lundstrom et al. | 380/253 |
| 4,357,852 | A * | 11/1982 | Suenaga | 84/681 |
| 4,706,290 | A * | 11/1987 | Lin | 381/58 |
| 5,499,301 | A * | 3/1996 | Sudo et al. | 381/71.3 |
| 5,668,885 | A | 9/1997 | Oda | |
| 5,923,766 | A | 7/1999 | Oda | |
| 6,014,617 | A * | 1/2000 | Kawahara | 704/207 |
| 6,285,767 | B1 * | 9/2001 | Klayman | 381/17 |
| 7,639,597 | B2 * | 12/2009 | Shattil | 370/203 |
| 7,657,039 | B2 * | 2/2010 | Miyashita et al. | 381/97 |
| 2004/0213351 | A1 * | 10/2004 | Shattil | 375/260 |
| 2004/0258246 | A1 | 12/2004 | Tanghe | |
| 2005/0046474 | A1 * | 3/2005 | Matsumoto et al. | 330/10 |
| 2005/0074133 | A1 * | 4/2005 | Miyashita | 381/103 |
| 2005/0084117 | A1 * | 4/2005 | Miyashita et al. | 381/97 |
| 2005/0159148 | A1 * | 7/2005 | Habuka et al. | 455/423 |
| 2005/0165603 | A1 * | 7/2005 | Bessette et al. | 704/200.1 |
| 2005/0185802 | A1 * | 8/2005 | Yoshida | 381/98 |
| 2005/0256404 | A1 * | 11/2005 | Sato | 600/437 |
| 2007/0003075 | A1 * | 1/2007 | Cooper et al. | 381/98 |
| 2007/0299655 | A1 * | 12/2007 | Laaksonen et al. | 704/205 |
| 2008/0140425 | A1 * | 6/2008 | Shimada | 704/500 |
| 2009/0041265 | A1 * | 2/2009 | Kubo | 381/98 |
| 2010/0215192 | A1 * | 8/2010 | Minnaar | 381/98 |
| 2010/0316226 | A1 * | 12/2010 | Yoneda et al. | 381/59 |

FOREIGN PATENT DOCUMENTS

| | | |
|---|---|---|
| JP | 5-199576 | 8/1993 |
| JP | 8-95567 A | 4/1996 |
| JP | 08-237800 A | 9/1996 |
| JP | 2002-524996 A | 8/2002 |
| JP | 2005-506781 A | 3/2005 |
| JP | 2005-117279 | 4/2005 |

* cited by examiner

*Primary Examiner* — Laura Menz

(74) *Attorney, Agent, or Firm* — Birch, Stewart, Kolasch & Birch, LLP

(57) ABSTRACT

A sound signal processing device causes an amplifier to amplify a low frequency signal and synthesizes the amplified low frequency signal with a middle or high frequency signal so as to output the resultant output signal. A gain control section controls a gain of the amplifier on the basis of an amplitude of the output signal. As a result, it is possible to amplify the low frequency signal without any clipping in a receiving end device and without any unstable volume of a middle or high frequency component.

8 Claims, 30 Drawing Sheets

SOUND SIGNAL PROCESSING DEVICE, SOUND SIGNAL PROCESSING METHOD, SOUND SIGNAL PROCESSING PROGRAM, STORAGE MEDIUM, AND DISPLAY DEVICE

This Nonprovisional application claims priority under 35 U.S.C. §119(a) on Patent Application No. 204755/2007 filed in Japan on Aug. 6, 2007, the entire contents of which are hereby incorporated by reference.

FIELD OF THE INVENTION

The present invention relates to a sound signal processing device and a sound signal processing method whereby bass is enhanced. Further, the present invention relates to (a) a sound signal processing program for causing a digital signal processor to function as such a sound signal processing device and (b) a storage medium storing such a sound signal processing program. Also, the present invention relates to a display device having such a sound signal processing device.

BACKGROUND OF THE INVENTION

A human audio frequency band ranges from 20 Hz to 20 kHz. In case of reproducing sound with a small speaker, it is impossible to obtain a sufficient sound pressure level corresponding to bass whose frequency is equal to or lower than 100 Hz, so that generally the bass is likely to be insufficient. Particularly, in view of such current trend that a display device represented by a liquid crystal television is made thinner, it is an important object to reproduce sound having sufficiently great bass with a small speaker which can be installed in the display device.

FIG. 30 is a graph illustrating an example of frequency characteristic of a small speaker which can be installed in a television. A sound pressure significantly drops at a low frequency equal to or lower than 100 Hz. Actually, a sound pressure at 50 Hz is lower than a sound pressure at 100 Hz by about 20 dB.

As a technique for reproducing sound having sufficient bass with such a small speaker, it is known to adopt a technique in which false feeling of human auditory sense is utilized to enhance the bass in a virtual manner.

For example, an overtone addition device described in Japanese Unexamined Patent Publication No. 95567/1996 (Tokukaihei 8-95567)(Publication date: Apr. 12, 1996) extracts, from an inputted sound signal, a signal corresponding to a predetermined band containing a fundamental wave and mixes overtones of the fundamental wave generated from the extracted signal with the sound signal, so as to output the mixture (see FIG. 1 of the document). According to the overtone addition device, even in case where it is impossible to output a fundamental wave of 100 Hz with a sufficient sound pressure from a speaker, the overtones (200 Hz, 300 Hz, . . . ) can be emphasized so as to output from the speaker the sound processed in this manner. As a result, it is possible to cause a listener to feel as if the fundamental wave of 100 Hz was outputted with a sufficient sound pressure.

Further, a sound enhancement system described in Japanese National Publication of Translated Version No. 524996/2002 (Tokuhyo 2002-524996)(Publication date: Aug. 6, 2002) extracts, from a low frequency signal having been extracted by a low-pass filter, a group of low frequency signals whose bands are different from each other by using a plurality of band-pass filters. Further, the low frequency signal group having been extracted by the band-pass filters are amplified by using a gain-variable amplifier, and then the amplified low frequency signal group is synthesized, thereby obtaining a low frequency signal to be mixed with an inputted sound signal (see FIG. 16 of the document).

However, in each of the foregoing conventional devices, an output level of the output signal exceeds an acceptable level (clip level) of a receiving end device (a D/A converter, a power amplifier, and the like), which results in such a problem that sound finally outputted from the speaker is distorted.

This problem is more specifically described as follows.

In the overtone addition device described in Tokukaihei 8-95567, the inputted sound signal and the generated overtones are respectively amplified by an amplifier so as to be mixed with each other. Thus, even if an input level (amplitude of the sound signal) does not cause any clipping in a receiving end device, an output level often exceeds the acceptable level of the receiving end device due to amplification of the sound signal or addition of the amplified overtones to the sound signal. As a result, sound outputted from the speaker is likely to be distorted.

Further, in the sound enhancement system described in Tokuhyo 2002-524996, a gain of the amplifier for amplifying the low frequency signal group extracted with the plurality of band-pass filters is controlled in accordance with low frequency signals to be inputted to the band-pass filters. Thus, clipping less occurs than the overtone addition device described in Tokukai 8-95567. However, the gain of the amplifier of the sound enhancement system is controlled in accordance with the low frequency signals which have not been inputted to the band-pass filters, so that the acceptable level of the receiving end device is easily exceeded by an output level of an output signal outputted after (i) a stage in which the low frequency signal group having passed through the band-pass filters is amplified, (ii) a stage in which the amplified low frequency signal group is synthesized, and (iii) a stage in which the synthesized low frequency signals are mixed with the original sound signal. Further, if the gain of the amplifier is set to be low so as not to cause the clipping, the low frequency signal group is not sufficiently amplified, which results in such a problem that sufficient bass cannot be obtained.

SUMMARY OF THE INVENTION

In view of the foregoing problems, the present invention was made, and an object of the present invention is to realize a sound signal processing device which prevents clipping in a receiving end device without fail and which can output a sound signal having sufficient bass sound.

In order to solve the foregoing problems, a sound processing device according to the present invention comprising: sound signal separation means for separating a low frequency signal from a sound signal; low frequency signal amplification/attenuation means, being gain-variable, for either amplifying or attenuating the low frequency signal having been separated; sound signal synthesis means for synthesizing the low frequency signal, having been amplified or attenuated, with at least part of the sound signal so as to obtain an output signal; and gain control means for controlling a gain of the low frequency signal amplification/attenuation means on the basis of the output signal having been obtained.

According to the arrangement, it is possible to obtain an output signal by synthesizing (i) the low frequency signal which has been separated from the sound signal and amplified or attenuated with (ii) at least part of the sound signal. That is, it is possible to obtain such an output signal that the low frequency component of the sound signal is emphasized.

Thus, if the speaker is driven on the basis of the resultant output signal, it is possible to reproduce sound having sufficient bass.

Moreover, according to the arrangement, the gain of the low frequency signal amplification/attenuation means is controlled on the basis of the output signal obtained by synthesizing the amplified or attenuated low frequency signal with at least part of the sound signal. Thus, in case of outputting the resultant output signal to the receiving end device, it is possible to prevent clipping in the receiving end device without fail.

Further, according to the arrangement, the gain controlled by the gain control means is a gain of the low frequency signal amplification/attenuation means for amplifying or attenuating the separated low frequency signal. Thus, an amplification factor or an attenuation factor of the low frequency signal may increase or decrease, but an amplification factor or an attenuation factor of a middle or high frequency signal other than the low frequency signal neither increases nor decreases. Thus, even in case where the sound signal contains a low frequency signal having a great amplitude, the amplification factor of the middle or high frequency signal is kept constant. Thus, if the speaker is driven in accordance with the resultant output signal, there is no unstable sound volume at a middle or high frequency.

Note that, the low frequency signal separated from the sound signal is obtained by attenuating a middle or high frequency component equal to or higher than a predetermined frequency out of components contained in the sound signal for example, and the low frequency signal is constituted mainly of a low frequency component equal to or lower than the predetermined frequency.

Further, a signal synthesized with the amplified low frequency signal may be the sound signal or may be part of the sound signal, e.g., the middle or high frequency signal, constituted mainly of the middle or high frequency component equal to or higher than the predetermined frequency, which middle or high frequency is obtained by attenuating the low frequency component equal to or lower than the predetermined frequency out of the sound signal.

Further, the gain control means may be arranged in any manner as long as the gain of the low frequency signal amplification/attenuation means is controlled so that an amplitude of the output signal outputted from the sound signal processing device is kept within a predetermined range. For example, the gain control means may be arranged so that: the gain of the low frequency signal amplification/attenuation means is decreased when the amplitude of the output signal is equal to or higher than a predetermined threshold value, and the gain of the low frequency signal amplification/attenuation means is increased when the amplitude of the output signal is lower than the predetermined threshold value.

Note that, the low frequency signal amplification/attenuation means may amplify or may attenuate or may suitably amplify and attenuate the separated low frequency signal. In other words, it may be so arranged that the gain of the low frequency signal amplification/attenuation means can have only a positive value in terms of decibel unit, or it may be so arranged that the gain can have only a negative value in terms of decibel unit, or it may be so arranged that the gain can have both the positive and negative values in terms of decibel unit.

In case where the gain of the low frequency signal amplification/attenuation means can have a negative value, it is possible to more surely prevent occurrence of clipping in the receiving end device when a sound signal having a great amplitude exceeding a clipping level of the receiving end device is inputted to the sound signal processing device. Note that, as a state in which the sound signal having such a great amplitude can be inputted to the sound signal processing device, the following cases are conceivable. For example, in case where a virtual surround process or an equalization process is carried out at a stage preceding to the sound signal processing device to excessively emphasize a low frequency component, or in case where a multi-channel down-mix process is carried out at a stage preceding to the sound signal processing device to add plural-channel sound signals, the sound signal having a great amplitude can be inputted to the sound signal processing device.

Note that, human auditory sense is more likely to perceive clipping caused by a low frequency signal as distortion than clipping caused by a middle or high frequency signal. Thus, in lessening the distortion, it is particularly effective to attenuate the low frequency signal in the foregoing manner. The human auditory sense is likely to perceive the clipping caused by the low frequency signal for the following reason. When the low frequency signal causes the clipping, harmonics occur in a highly-audible high frequency range (see a known equal loudness curve).

Further, in order to solve the foregoing problems, a sound signal processing method according to the present invention comprising the steps of: separating a low frequency signal from a sound signal; causing low frequency signal amplification/attenuation means, being gain-variable, to either amplify or attenuate the low frequency signal having been separated; synthesizing the low frequency signal, having been amplified or attenuated, with at least part of the sound signal so as to obtain an output signal; and controlling a gain of the low frequency signal amplification/attenuation means on the basis of the output signal.

According to the arrangement, as in the aforementioned sound signal processing device, it is possible to obtain an output signal having sufficient bass in being outputted from the speaker without any clipping in the receiving end device and without unstable sound volume at middle and high frequency bands in being outputted from the speaker.

Note that, the sound signal processing device may be realized as a digital signal processor (DSP). In this case, (i) a sound signal processing program which causes the digital signal processor to function as the aforementioned means so that the digital signal processor operates as the sound signal processing device and (ii) a storage medium storing the program are included in the present invention.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 4(*b*), showing an Example of the present invention, is a graph illustrating a frequency characteristic of the low frequency signal inputted to the harmonics addition section.

FIG. 5(*b*), showing an Example of the present invention, is a graph illustrating a frequency characteristic of the low frequency signal having been subjected to the half-wave rectification.

FIG. 6(*b*), showing an Example of the present invention, is a graph illustrating a frequency characteristic of the low frequency signal having passed through the high-pass filter.

FIG. 7(*b*), showing an Example of the present invention, is a graph illustrating a frequency characteristic of the low frequency signal having passed through the low-pass filter.

FIG. 8(*b*), showing an Example of the present invention, is a graph illustrating a frequency characteristic of the low frequency signal having been added by the adder.

FIG. 9(*b*), showing another Example of the present invention, is a graph illustrating a frequency characteristic of the low frequency signal having been subjected to half-wave rectification and having been squared.

FIG. 10(*b*), showing another Example of the present invention, is a graph illustrating a frequency characteristic of the low frequency signal having passed through the high-pass filter.

FIG. 11(*b*), showing another Example of the present invention, is a graph illustrating a frequency characteristic of the low frequency signal having passed through the low-pass filter.

FIG. 12(*b*), showing another Example of the present invention, is a graph illustrating a frequency characteristic of the low frequency signal having been added by the adder.

FIG. 13(*b*), showing a conventional art, is a graph illustrating a frequency characteristic of the signal obtained by carrying out the full-wave rectification with respect to the input signal of 200 Hz.

FIG. 14(*b*), showing a conventional art, is a graph illustrating a frequency characteristic of the signal having passed through the high-pass filter and the low-pass filter.

FIG. 15(*b*), showing an Example of the present invention, is a graph illustrating a frequency characteristic of the signal obtained by carrying out the half-wave rectification with respect to the input signal of 200 Hz.

FIG. 16(*b*), showing an Example of the present invention, is a graph illustrating a frequency characteristic of the signal having passed through the high-pass filter and the low-pass filter.

FIG. 20(*b*), showing an Example of the present invention, is a graph illustrating a frequency characteristic of the sound signal inputted to the sound signal processing device.

FIG. 21(*b*), showing an Example of the present invention, is a graph illustrating a frequency characteristic of the output signal obtained by inputting the sound signal illustrated in FIG. 20(*a*) and FIG. 20(*b*) into the sound signal processing device.

FIG. 22(*b*), showing another Example of the present invention, is a graph illustrating a frequency characteristic of the sound signal inputted to the sound signal processing device.

FIG. 23(*b*), showing another Example of the present invention, is a graph illustrating a frequency characteristic of the output signal obtained by inputting the sound signal illustrated in FIG. 22(*a*) and FIG. 22(*b*) into the sound signal processing device.

FIG. 24(*b*), showing another Example of the present invention, is a graph illustrating a frequency characteristic of the sound signal inputted to the sound signal processing device.

FIG. 25(*b*), showing another Example of the present invention, is a graph illustrating a frequency characteristic of the output signal obtained by inputting the sound signal illustrated in FIG. 24(*a*) and FIG. 24(*b*) into the sound signal processing device.

FIG. 26(*b*) is a graph illustrating the signal waveform of the signal obtained by amplifying the sound signal, containing the super-low frequency component and the low frequency component, not via the high-pass filter.

FIG. 27(*b*) is a graph illustrating the signal waveform of the signal obtained by amplifying the sound signal, containing the super-low frequency component and the low frequency component, via the high-pass filter.

DESCRIPTION OF THE EMBODIMENTS

Embodiment 1

The following description will explain a sound signal processing device 100 according to an embodiment of the present invention with reference to the attached drawings.

<As to an Arrangement of the Sound Signal Processing Device>

First, with reference to FIG. 1, the arrangement of the sound signal processing device 100 is described as follows.

Figure 1:
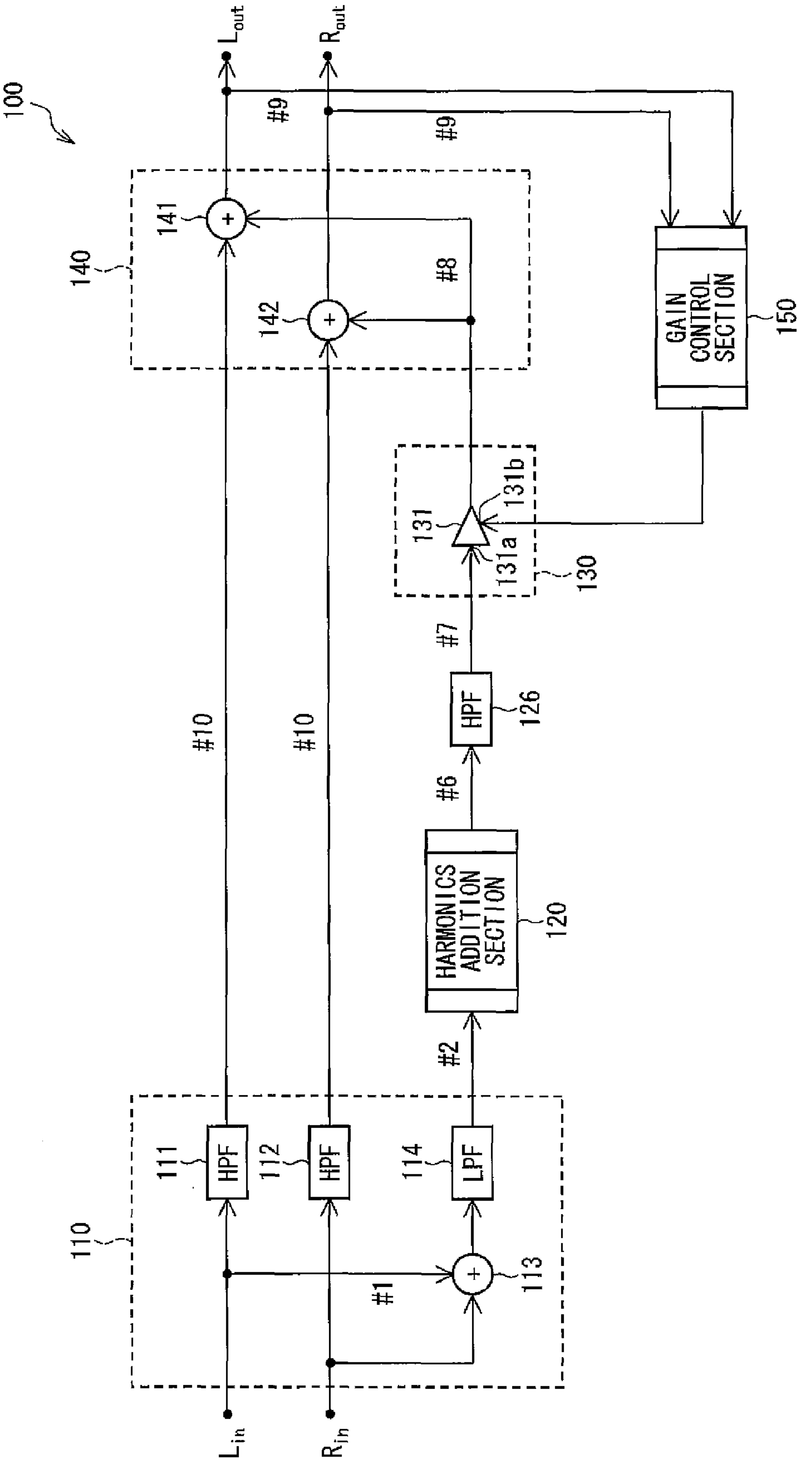
FIG. 1, showing an embodiment of the present invention, is a block diagram illustrating an arrangement of a sound signal processing device.

FIG. 1 is a block diagram illustrating the arrangement of the sound signal processing device 100. The sound signal processing device 100 processes digital sound signals, having been inputted via input sections Lin and Rin respectively, so as to output the processed digital sound signals via output sections Lout and Rout. As a receiving end device connected to the output sections Lout and Rout so as to receive the processed digital sound signals, a power amplifier (not shown) connected to the sound signal processing device 100 via a D/A converter (not shown) is conceivable for example.

As illustrated in FIG. 1, the sound signal processing device 100 schematically includes a sound signal separation section 110 (sound signal separation means), a harmonics addition section 120 (harmonics addition means), a low frequency amplification section 130 (low frequency amplification/attenuation means), a sound signal synthesis section 140 (sound signal synthesis means), and a gain control section 150 (gain control means). The sound signal processing device 100 can be realized by causing a digital signal processor (DSP) to function as the respective sections. The sections of the sound signal processing device 100 are described as follows with reference to FIG. 1.

(Sound Signal Separation Section)

The sound signal separation section 110 is means for dividing an inputted sound signal #1 into a low frequency signal #2 and middle or high frequency signals #10. Herein, the low frequency signal is a sound signal constituted mainly of a signal component equal to or lower than a predetermined frequency (e.g., 200 Hz). Further, each of the middle or high frequency signals is a sound signal constituted mainly of a signal component equal to or higher than a predetermined frequency (e.g., 200 Hz).

As illustrated in FIG. 1 for example, the sound signal separation section 110 includes: a high-pass filter 111 connected to the input section Lin which allows a left-channel sound signal to be inputted; a high-pass filter 112 connected to the input section Rin which allows a right-channel sound signal to be inputted; an adder 113 connected to the input sections Lin and Rin; and a low-pass filter 114 connected to the adder 113.

In the arrangement of FIG. 1, the high-pass filter 111 attenuates a low frequency component which is contained in the left-channel sound signal #1 inputted via the input section Lin and which is equal to or lower than a frequency L111, and the high-pass filter 111 supplies a remaining middle or high frequency signal #10 to the sound signal synthesis section 140. Further, the high-pass filter 112 attenuates a low frequency component which is contained in the right-channel sound signal #1 inputted via the input section Rin and which is equal to or lower than a frequency L112, and the high-pass filter 112 supplies a remaining middle or high frequency signal #10 to the sound signal synthesis section 140. While, the left-channel sound signal #1 inputted via the input section Lin and the right-channel sound signal #1 inputted via the input section Rin are subjected to an addition process of the adder 113 and then are supplied to the low-pass filter 114. The low-pass filter 114 attenuates a middle or high frequency component which is contained in each resultant sound signal #1 and which is equal to or higher than a predetermined frequency H114, and the low-pass filter 114 supplies a remaining low frequency signal #2 to the harmonics addition section 120. Note that, the high-pass filters 111 and 112 may be omitted. In case where the high-pass filters 111 and 112 are omitted, the sound signals #1 respectively inputted via the input sections Lin and Rin are supplied to the sound signal synthesis section 140.

(Harmonics Addition Section)

The harmonics addition section 120 is means for adding harmonics containing a fundamental wave (primary wave) to the low frequency signal #2 having been separated by the sound signal separation section 110.

Schematically, the harmonics addition section 120 (1) carries out half-wave rectification with respect to the low frequency signal #2 having been separated by the sound signal separation section 110 or (2) carries out half-wave rectification with respect to the low frequency signal #2 having been separated by the sound signal separation section 110 and squares the low frequency signal #2 having been subjected to the half-wave rectification, thereby adding the harmonics containing the fundamental wave to the low frequency signal #2. The low frequency signal #2 to which the harmonics have been added by the harmonics addition section 120 is supplied to the low frequency signal amplification section 130 via the high-pass filter 126. The harmonics addition section 120 will be detailed later with reference to another drawing.

The high-pass filter 126 functions as low frequency component attenuation means for attenuating a low frequency component, contained in a low frequency signal #6 to which the harmonics have been added by the harmonics addition section 120 (i.e., a lower frequency signal to be inputted to the low frequency signal amplification section 130) and being equal to or lower than a predetermined frequency. Also the high-pass filter 126 will be detailed later with reference to another drawing.

(Low Frequency Signal Amplification Section)

The low frequency signal amplification section 130 is means for amplifying the low frequency signal #6 to which the harmonics have been added by the harmonics addition section 120. Specifically, the low frequency signal amplification section 130 amplifies a low frequency signal #7 inputted via the high-pass filter 126. As illustrated in FIG. 1 for example, the low frequency signal amplification section 130 includes an amplifier 131 connected to the harmonics addition section 120 and to the gain control section 150.

The amplifier 131 is a gain-variable amplifier and includes: a sound signal input section 131*a* for allowing a sound signal which should be amplified to be inputted; and a control signal input section 131*b* for allowing a control signal for controlling the gain to be inputted. To the sound signal input section 131*a*, the low frequency signal #6 to which the harmonics have been added by the harmonics addition section 120 is inputted via the high-pass filter 126 as the sound signal which should be amplified. While, to the control signal input section 131*b*, the control signal for controlling the gain of the amplifier 131 is inputted from the gain control section 150.

Note that, in FIG. 1, the low frequency signal amplification section 130 includes the amplifier 131 so as to have a positive gain in terms of decibel unit. However, the low frequency signal amplification section 130 may be arranged so that, for example, an attenuator is provided instead of the amplifier 131 so as to have a negative gain in terms of decibel unit. Further, it may be so arranged that a combination of the amplifier and the attenuator is provided so as to be capable of having both positive and negative gains.

(Sound Signal Synthesis Section)

The sound signal synthesis section 140 is means for synthesizing (i) a low frequency signal #8 having been amplified by the low frequency signal amplification section 130 with (ii) the middle or high frequency signal #10 having been separated by the sound signal separation section 110, so as to obtain output signals #9.

As illustrated in FIG. 1 for example, the sound signal synthesis section 140 includes: an adder 141 connected to the sound signal separation section 110 (specifically, the high-pass filter 111) and the low frequency signal amplification section 130; and an adder 142 connected to the sound signal separation section 110 (specifically, the high-pass filter 112) and the low frequency signal amplification section 130.

In the arrangement of FIG. 1, the adder 141 adds the left-channel middle or high frequency signal #10 having been separated by the high-pass filter 111 to the low frequency signal #8 having been amplified by the low frequency signal amplification section 130, so as to obtain a left-channel output signal #9. Further, the adder 142 adds the right-channel middle or high frequency signal #10 having been separated by the high-pass filter 112 to the low frequency signal #8 having been amplified by the low frequency signal amplification section 130, so as to obtain a right-channel output signal #9. The output signals #9 obtained by the adders 141 and 142 are respectively outputted via the output sections Lout and Rout to a receiving end device such as a D/A converter or the like and are supplied to the gain control section 150.

(Gain control Section)

The gain control section 150 is means for controlling the gain of the low frequency signal amplification section 130 in accordance with the output signals #9 obtained by the sound signal synthesis section 140.

Schematically, the gain control section 150 decreases the gain of the low frequency signal amplification section 150 when an amplitude of each output signal #9 obtained by the sound signal synthesis section 140 is equal to or higher than a predetermined threshold value, and the gain control section 150 increases the gain of the low frequency signal amplification section 150 when the amplitude of each output signal #9 obtained by the sound signal synthesis section 140 is lower than the predetermined threshold value, thereby keeping the amplitude of each of the output signals #9 respectively outputted via the output sections Lout and Rout within a predetermined range. As a result, it is possible to prevent clipping in the receiving end device, such as a D/A converter and a power amplifier, connected to the output sections Lout and Rout. The gain control section 150 will be detailed later with reference to another drawing.

<Details of the Harmonics Addition Section>

Next, with reference to FIG. 2 to FIG. 16, the harmonics addition section 120 of the sound signal processing device 100 is detailed as follows.

(Arrangement of the harmonics Addition Section)

Figure 2:
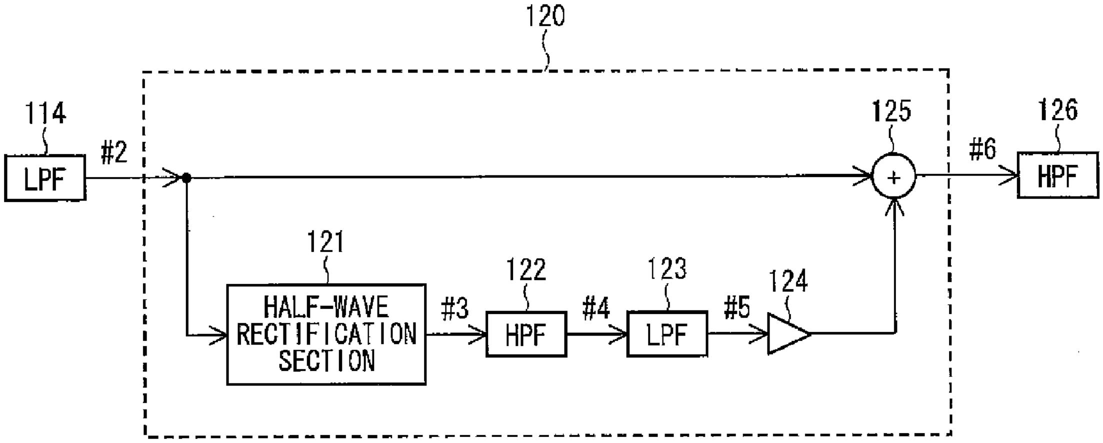
FIG. 2, showing an embodiment of the present invention, is a block diagram illustrating an arrangement of a harmonics addition section provided on the sound signal processing device.

With reference to FIG. 2, an example of the arrangement of the harmonics addition section 120 is explained as follows.

FIG. 2 is a block diagram illustrating the example of the arrangement of the harmonics addition section 120.

As illustrated in FIG. 2 for example, the harmonics addition section 120 includes: a half-wave rectification section 121 connected to the sound signal separation section 110; a high-pass filter 122 connected to the half-wave rectification section 121; a low-pass filter 123 connected to the high-pass filter 122; a volume 124 connected to the low-pass filter 123; and an adder 125 connected to the sound signal separation section 110 and the volume 124.

In the arrangement of FIG. 2, the low frequency signal #2 having been separated from the sound signal #1 by the sound signal separation section 110 is supplied to the half-wave rectification section 121. The half-wave rectification section 121 (1) carries out half-wave rectification with respect to the low frequency signal #2 or (2) carries out half-wave rectification with respect to the low frequency signal #2 and squares the low frequency signal #2 having been subjected to the half-wave rectification, thereby adding the harmonics containing the fundamental wave to the low frequency signal #2. The half-wave rectification section 121 may add the harmonics by adopting any one of the two methods. Alternatively, the half-wave rectification section 121 may be arranged so as to be capable of switching between the two methods in adding the harmonics, thereby adding the harmonics on the basis of the selected method out of the two methods. In this case, the method for adding the harmonics may be automatically switched by the sound signal processing device 100 or may be manually switched by a user.

Further, in the arrangement of FIG. 2, the low frequency signal #3 to which the harmonics have been added by the half-wave rectification section 121 is supplied to the high-pass filter 122. The high-pass filter 122 attenuates a low frequency component which is contained in the low frequency signal #3 supplied by the half-wave rectification section 121 and which is equal to or lower than a predetermined cutoff frequency L122, and the high-pass filter 122 supplies a resultant low frequency signal #4 to the low-pass filter 123. The low-pass filter 123 attenuates a low frequency component which is contained in the low frequency signal #4 supplied from the high-pass filter 122 and which is equal to or lower than a predetermined cutoff frequency H123, and the low-pass filter 123 supplies a resultant low frequency signal #5 to the adder 125 via the volume 124.

Further, in the arrangement of FIG. 2, the low frequency signal #5 outputted from the low-pass filter 123 is inputted to the adder 125 after its amplitude is adjusted by the volume 124. The low frequency signal #5 outputted by the low-pass filter 123 is inputted to the adder 125 via the volume 124, so that a ratio between the low frequency signal #2 and the low frequency signal #5 can be set to a desired value in a lower frequency signal #6 given by the adder 125. Herein, the volume 124 may be an attenuator for attenuating the low frequency signal #5 at a predetermined attenuation factor or may be an amplifier for amplifying the low frequency signal #5 at a predetermined amplification factor. The adder 125 adds the low frequency signal #5 whose amplitude has been adjusted by the volume 124 to the low frequency signal #2 having been separated by the sound signal separation section 110, so as to supply a resultant low frequency signal #6 to the low frequency signal amplification section 130 via the high-pass filter 126.

Note that, FIG. 2 illustrates the example of the arrangement in which the low-pass filter 123 is disposed at a following stage of the high-pass filter 122 connected to the half-wave rectification section 121. However, the arrangement of the harmonics addition section 120 is not limited to this. For example, the harmonics addition section 120 may be arranged so that the low-pass filter 123 is connected to the half-wave rectification section 121 and the high-pass filter 122 is connected to the following stage thereof or may be arranged so that a band-pass filter which functions as both the high-pass filter 122 and the low-pass filter 123 is connected to the half-wave rectification section 121.

(Example 1 of the Harmonics Addition)

With reference to FIG. 3 to FIG. 8, the following explains an Example of the harmonics addition carried out by the harmonics addition section 120 of FIG. 2.

In the present Example, the half-wave rectification 121 carries out half-wave rectification with respect to the low frequency signal #2 so as to add the harmonics containing the fundamental wave to the low frequency signal #2. Further, the cutoff frequency L122 of the high-pass filter 122 is set to 200 Hz, and the cutoff frequency H123 of the low-pass filter 123 is set to 300 Hz, and an amplification factor (or an attenuation factor) of the volume 24 is set to 0 dB.

Figure 3:
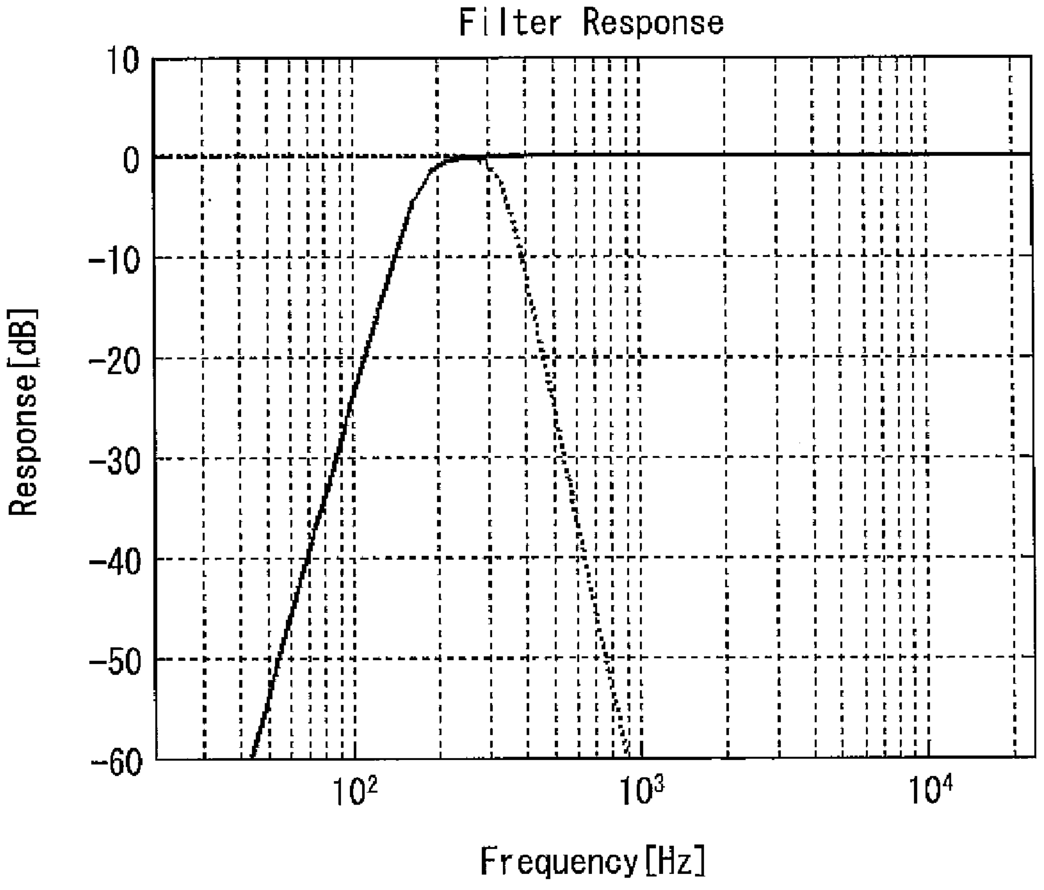
FIG. 3, showing an Example of the present invention, is a graph illustrating frequency characteristics of a low-pass filter and a high-pass filter.

FIG. 3 is a graph illustrating frequency characteristics of the high-pass filter 122 and the low-pass filter 123 of the present Example. In this figure, a continuous line indicates a frequency characteristic of the high-pass filter 122 whose cutoff frequency L122 is set to 200 Hz, and a dotted line indicates a frequency characteristic of the low-pass filter 123 whose cutoff frequency H123 is set to 300 Hz.

Figure 4:
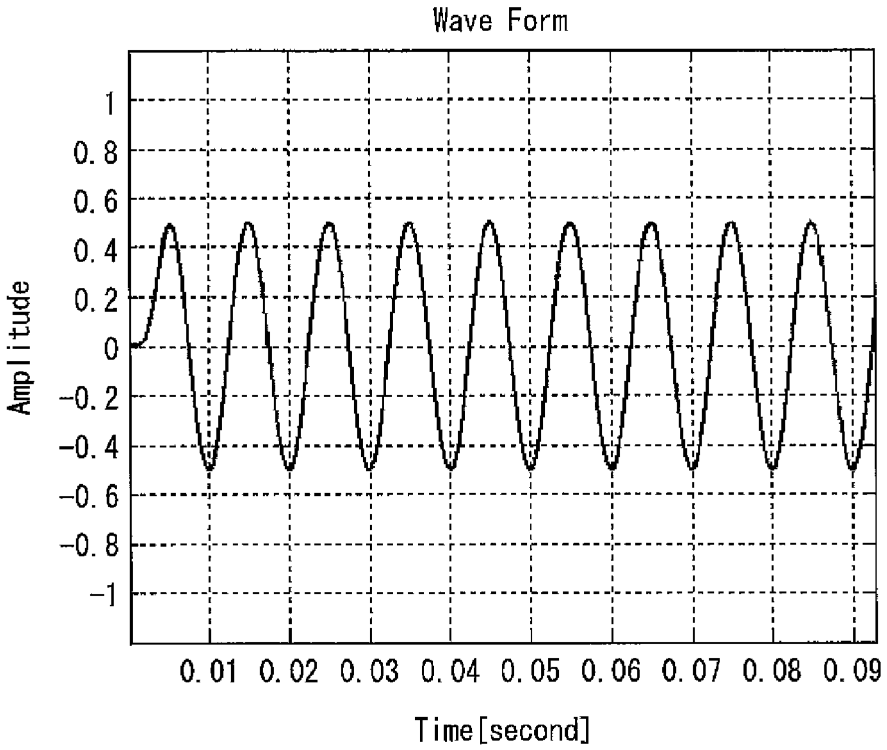
FIG. 4(*a*), showing an Example of the present invention, is a waveform chart illustrating a signal waveform of a low frequency signal inputted to the harmonics addition section.
Figure 4:
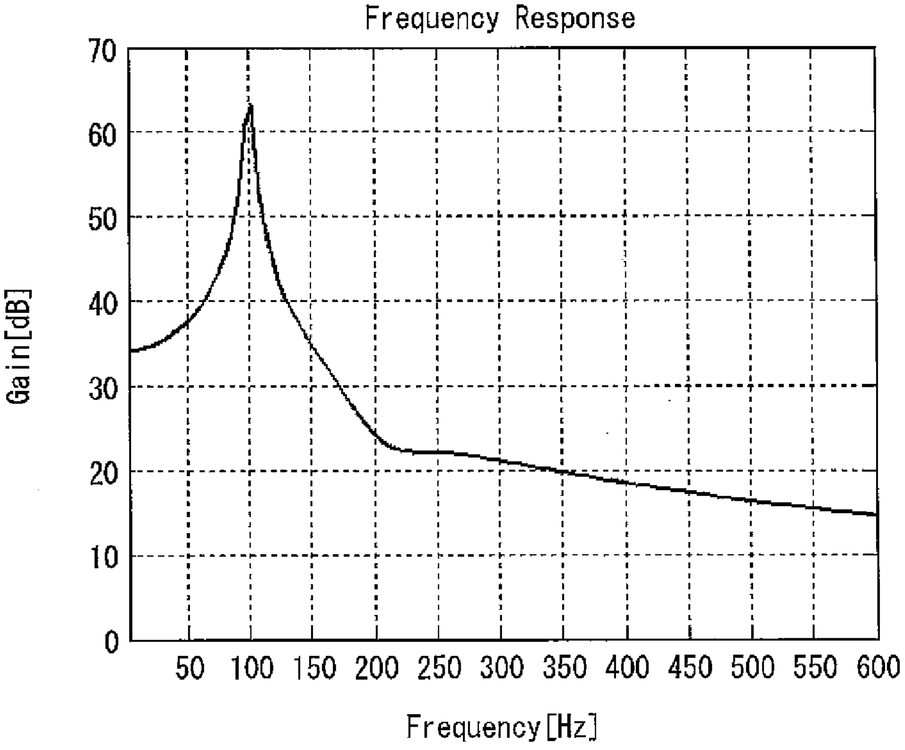

In the present Example, the low frequency signal #2 whose center frequency is 100 Hz is inputted to the harmonics addition section 120. FIG. 4(*a*) illustrates a waveform of the low frequency signal #2 having been inputted to the harmonics addition section 120 in the present Example. FIG. 4(*b*) is a graph illustrating a frequency characteristic of the low frequency signal #2.

Figure 5:
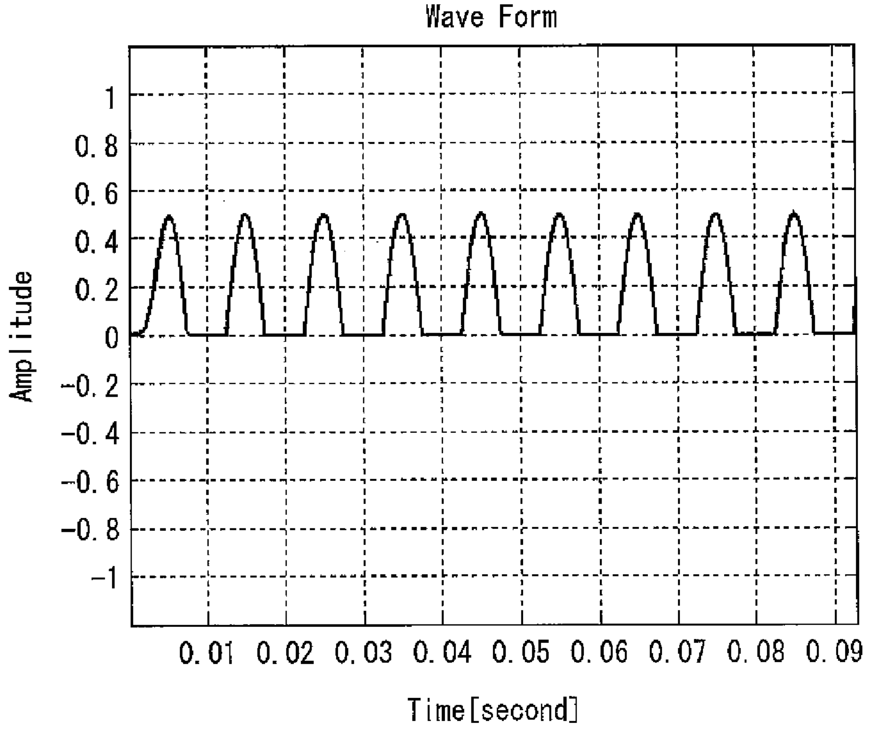
FIG. 5(*a*), showing an Example of the present invention, is a waveform chart illustrating a signal waveform of a low frequency signal having been subjected to half-wave rectification.
Figure 5:
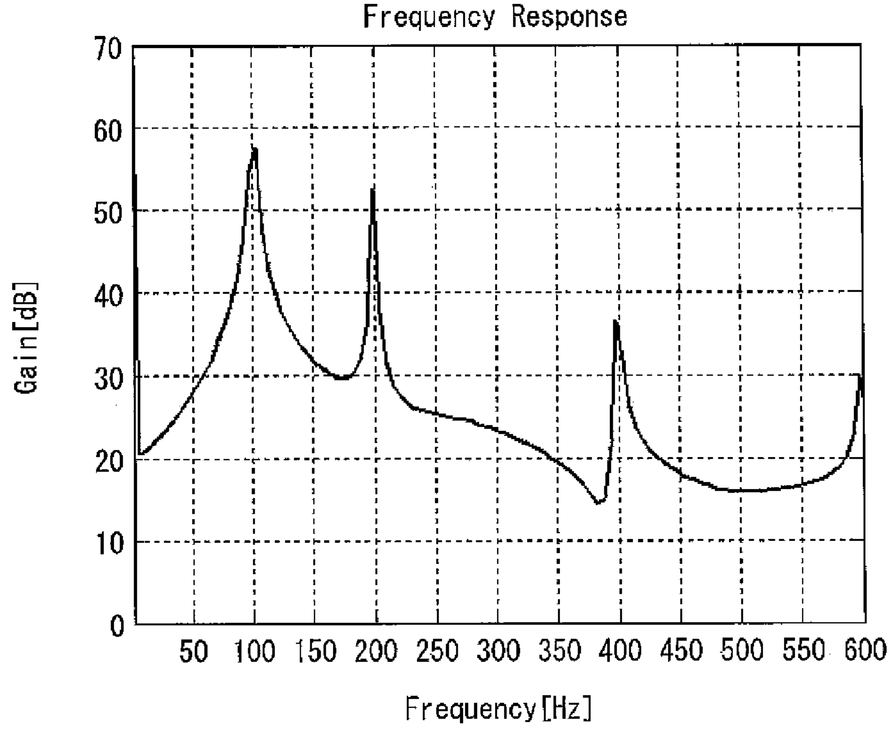

FIG. 5(*a*) is a waveform chart illustrating a waveform of the low frequency signal #3, having been subjected to the half-wave rectification by the half-wave rectification section 121. FIG. 5(*b*) is a graph illustrating a frequency characteristic of the low frequency signal #3. As apparent from FIG. 5(*b*), the half-wave rectification section 121 allows generation of the low frequency signal #3 containing (i) a 100 Hz fundamental wave equal to the center frequency of the low frequency signal #2 and (ii) even harmonics such as second, fourth, sixth, . . . , and similar harmonics each having a frequency even-number times as high as the center frequency of the original low frequency signal #2.

Figure 6:
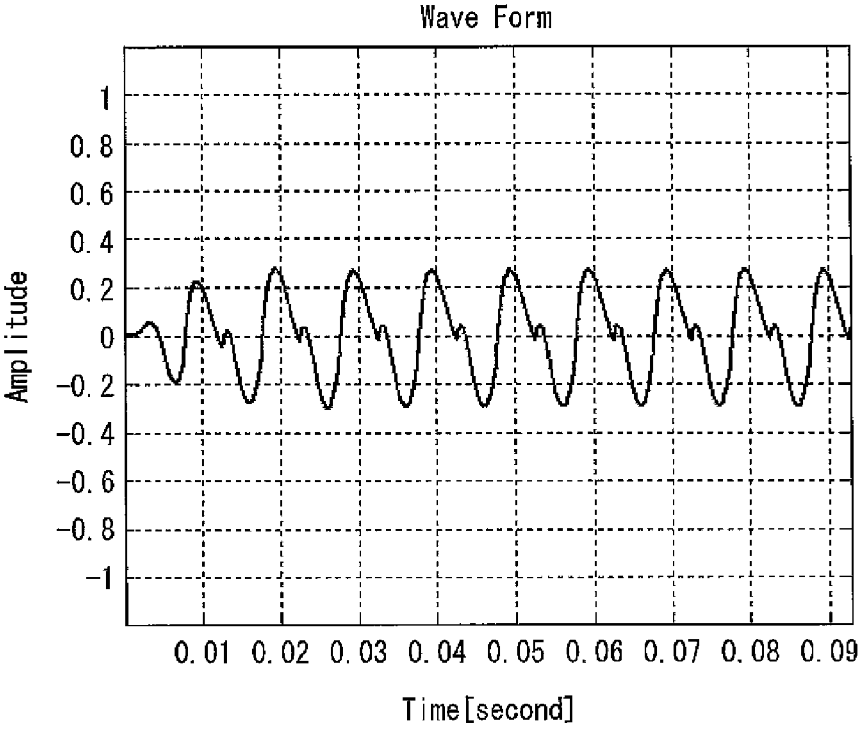
FIG. 6(*a*), showing an Example of the present invention, is a waveform chart illustrating a signal waveform of a low frequency signal having passed through the high-pass filter.
Figure 6:
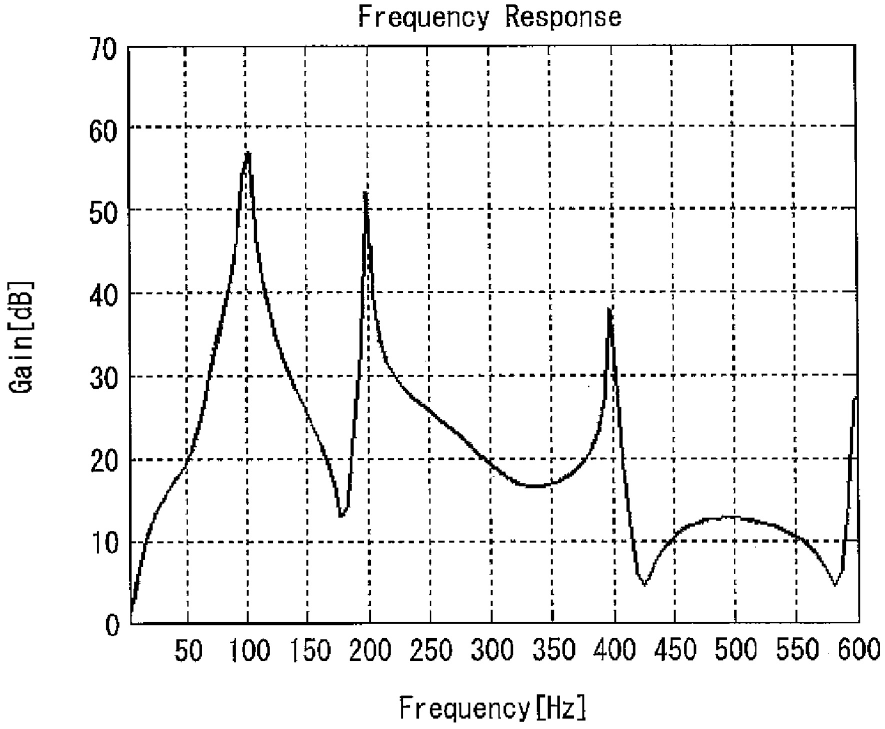

FIG. 6(*a*) is a waveform chart illustrating a waveform of the low frequency signal #4 whose low frequency component has been attenuated by the high-pass filter 122. FIG. 6(*b*) is a graph illustrating a frequency characteristic of the lower frequency signal #4. As apparent from FIG. 6, the high-pass filter 122 allows a DC component to be removed from the low frequency signal #3 and an unnecessary low frequency component equal to or lower than a reproducible lower limit frequency of the speaker to be removed from the low frequency signal #3.

Figure 7:
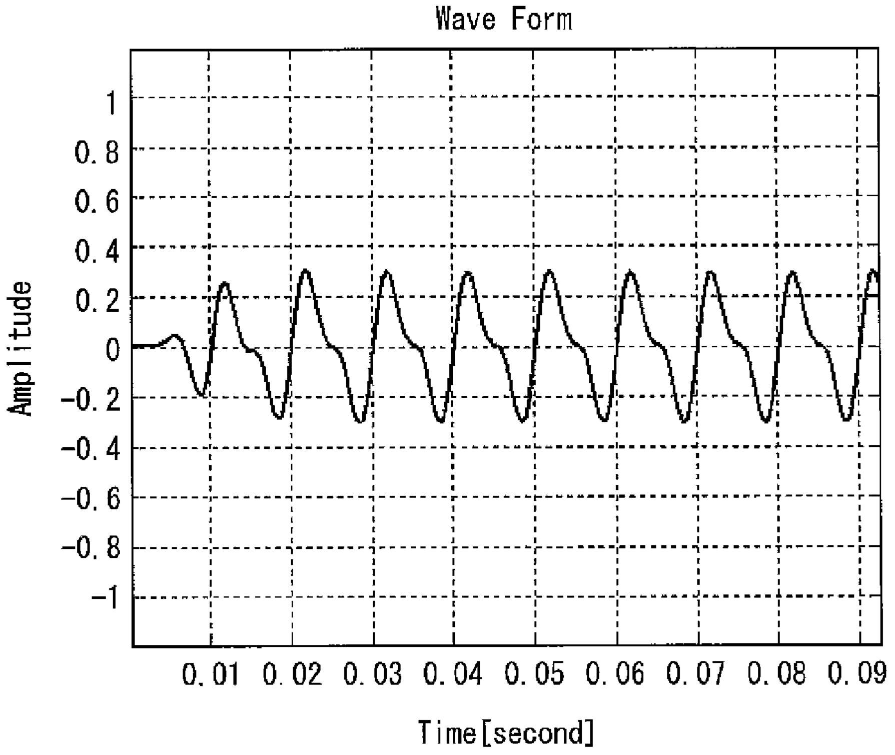
FIG. 7(*a*), showing an Example of the present invention, is a waveform chart illustrating a signal waveform of a low frequency signal having passed through the low-pass filter.
Figure 7:
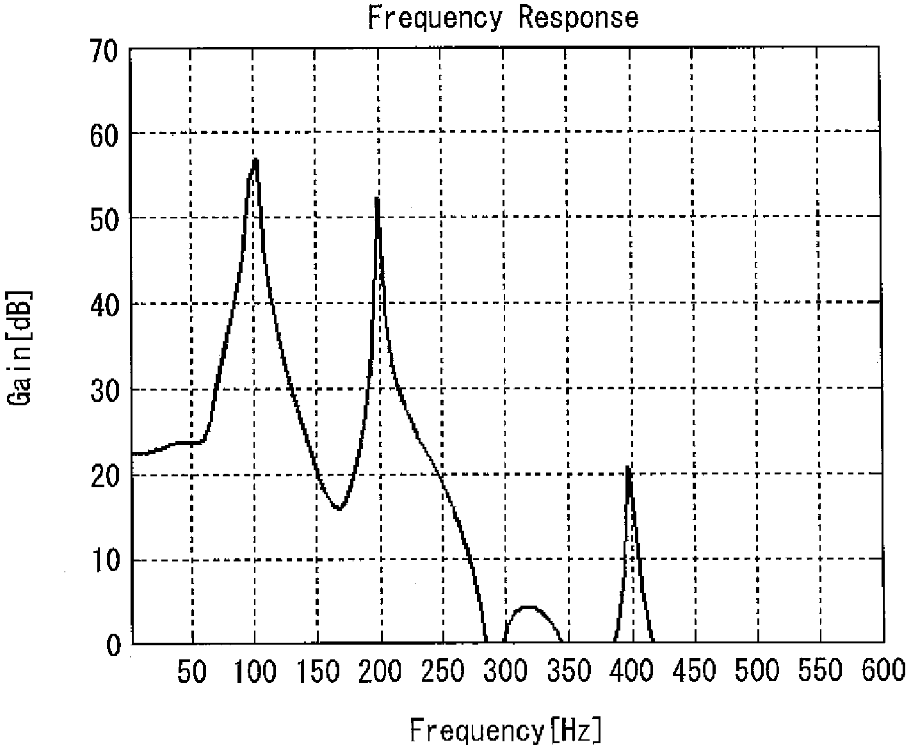

FIG. 7(*a*) is a waveform chart illustrating a waveform of the low frequency signal #5 whose high frequency component has been attenuated by the low-pass filter 123. FIG. 7(*b*) is a graph illustrating a frequency characteristic of the lower frequency signal #5. As apparent from FIG. 7(*b*), the low-pass filter 122 allows unnecessary high harmonics, specifically, sixth or further high harmonics to be removed from the low frequency signal #4.

Figure 8:
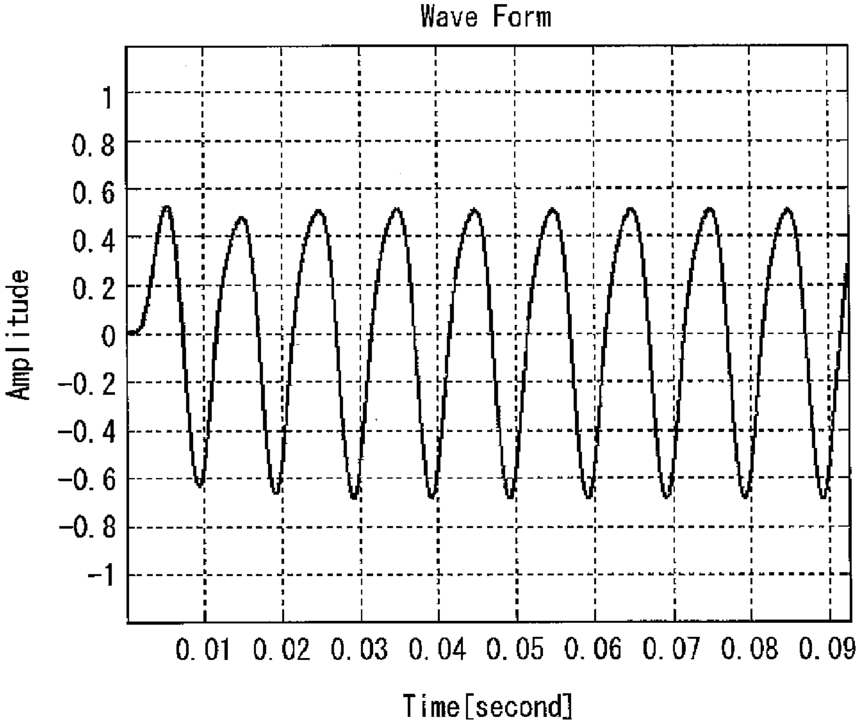
FIG. 8(*a*), showing an Example of the present invention, is a waveform chart illustrating a signal waveform of a low frequency signal having been added by an adder.
Figure 8:
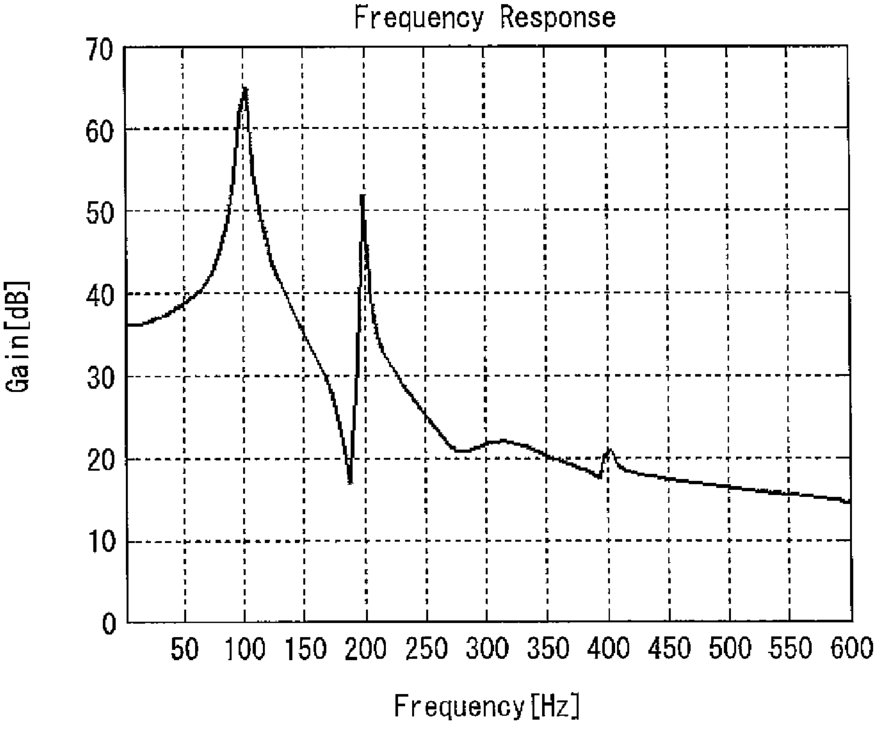

FIG. 8(*a*) is a waveform chart illustrating a waveform of the low frequency signal #6 having been obtained by adding the low frequency signal #5 to the low frequency signal #2 with the adder 125. FIG. 8(*b*) is a graph illustrating a frequency characteristic of the low frequency signal #6. As apparent from FIG. 8(*b*), the low frequency signal #6 having been outputted by the harmonics addition section 120 becomes a low frequency signal obtained by adding first, second, and fourth harmonics to the low frequency signal #2 having been inputted to the harmonics addition section 120.

(Example 2 of the Harmonics Addition)

With reference to FIG. 9 to FIG. 12, the following explains another Example of the harmonics addition carried out by the harmonics addition section 120 of FIG. 2.

In the present Example, the half-wave rectification 121 carries out half-wave rectification with respect to the low frequency signal #2 and squares the low frequency signal having been subjected to the half-wave rectification so as to add the harmonics containing the fundamental wave to the low frequency signal #2.

Also in the present Example, the cutoff frequency L122 of the high-pass filter 122 is set to 200 Hz, and the cutoff frequency H123 of the low-pass filter 123 is set to 300 Hz, and an amplification factor (or an attenuation factor) of the volume 24 is set to 0 dB as in Example 1. Also in the present Example, the low frequency signal #2 whose center frequency is 100 Hz illustrated in FIG. 4(*a*) and FIG. 4(*b*) is inputted to the harmonics addition section 120 as in Example 1.

Figure 9:
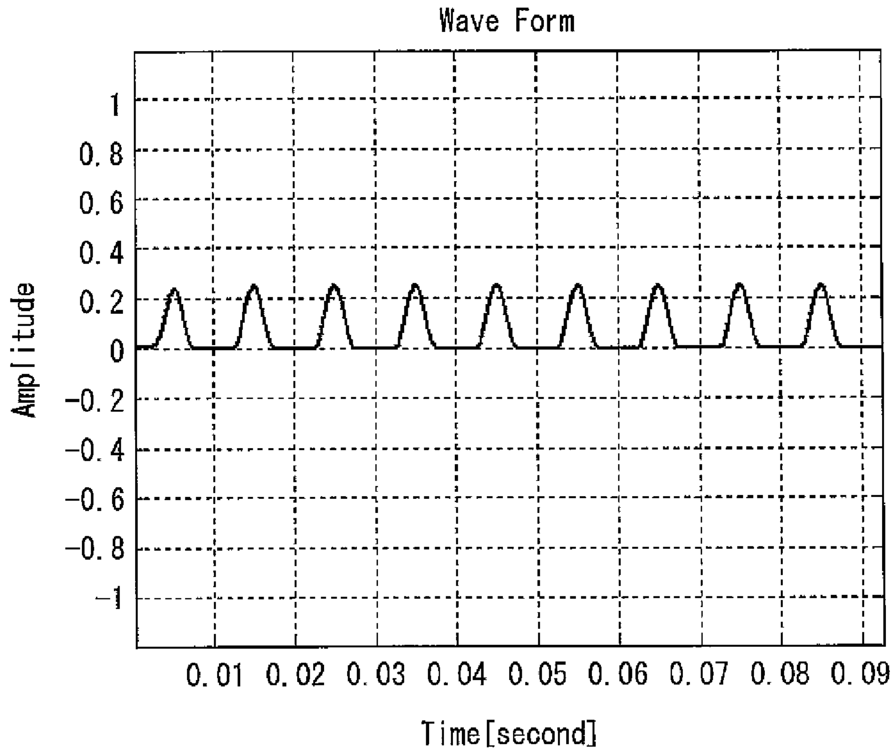
FIG. 9(*a*), showing another Example of the present invention, is a waveform chart illustrating a signal waveform of a low frequency signal having been subjected to half-wave rectification and having been squared.
Figure 9:
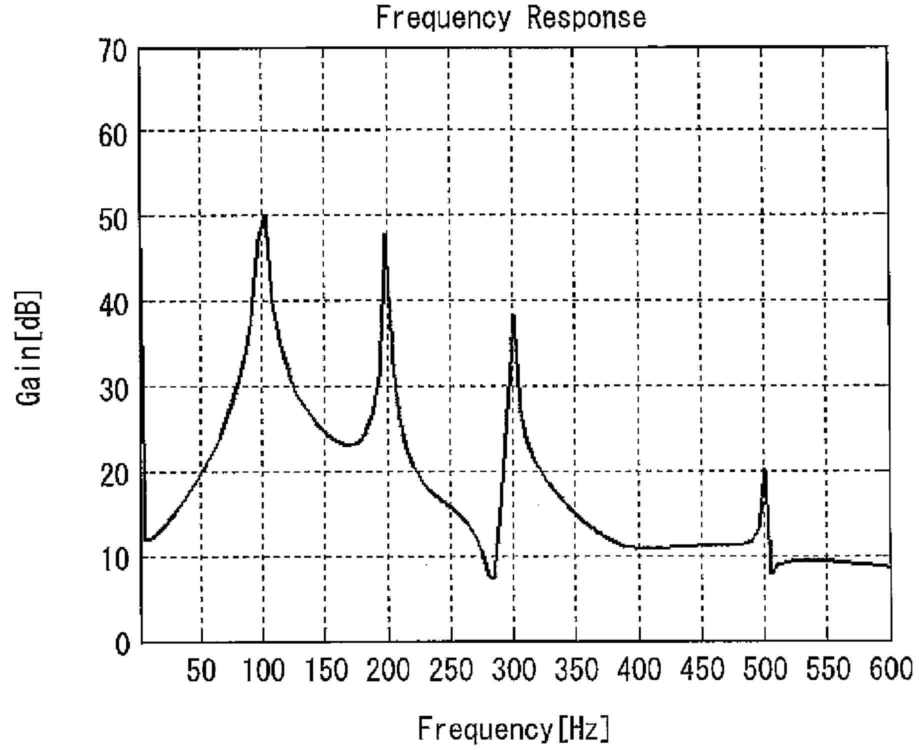

FIG. 9(*a*) illustrates a waveform of the low frequency signal #3 having been subjected to the half-wave rectification and having been squared by the half-wave rectification section 121. FIG. 9(*b*) is a graph illustrating a frequency characteristic of the low frequency signal #3. As apparent from FIG. 9(*b*), the half-wave rectification section 121 allows generation of the low frequency signal #3 containing (i) a 100 Hz fundamental wave equal to the center frequency of the original low frequency signal #2, (ii) a second harmonics whose frequency is twice as high as the center frequency of the original low frequency signal #2, and (iii) odd harmonics such as third, fifth, seventh, . . . , and similar harmonics each having a frequency odd-number times as high as the center frequency of the original low frequency signal #2.

Figure 10:
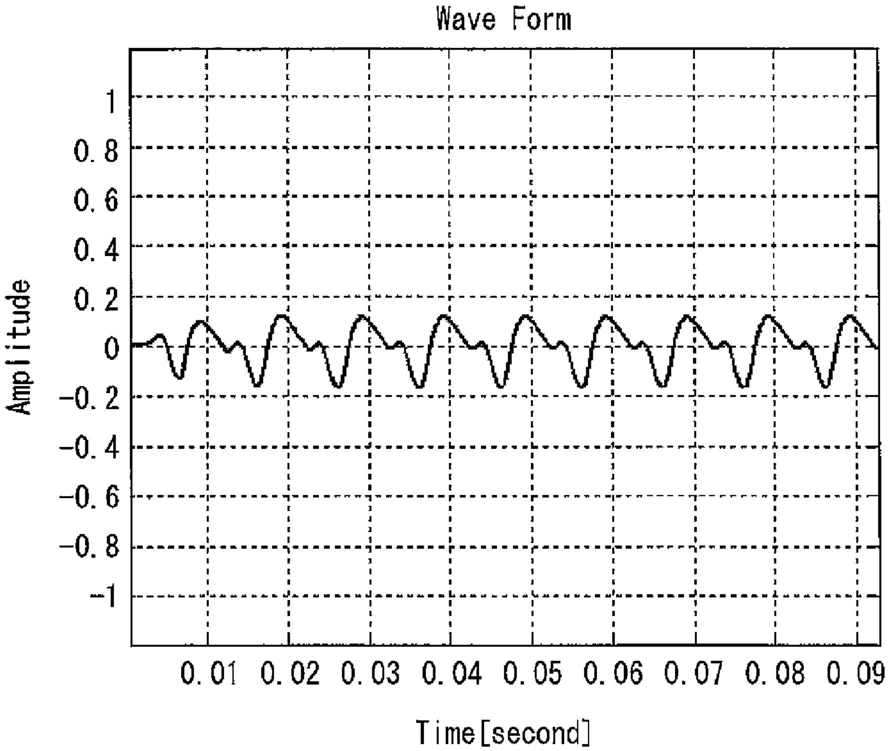
FIG. 10(*a*), showing another Example of the present invention, is a waveform chart illustrating a signal waveform of a low frequency signal having passed through the high-pass filter.
Figure 10:
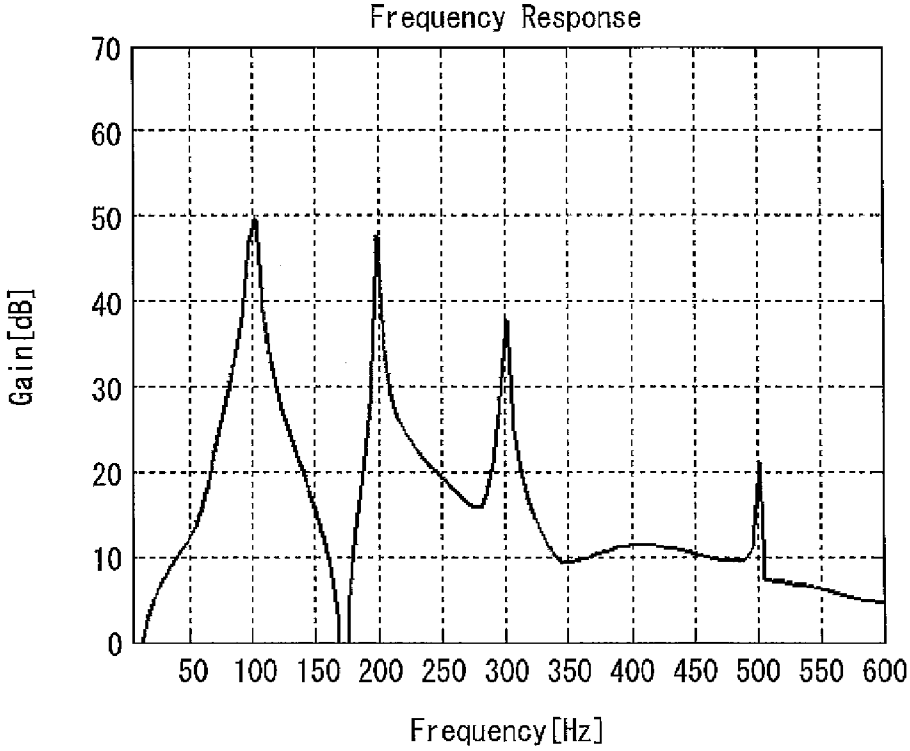

FIG. 10(*a*) is a waveform chart illustrating a waveform of the low frequency signal #4 whose low frequency component has been attenuated by the high-pass filter 122. FIG. 10(*b*) is a graph illustrating a frequency characteristic of the lower frequency signal #4. As apparent from FIG. 10(*b*), the high-pass filter 122 allows a DC component to be removed from the low frequency signal #3 and an unnecessary low frequency component equal to or lower than reproducible lower limit frequency of the speaker to be removed from the low frequency signal #3.

Figure 11:
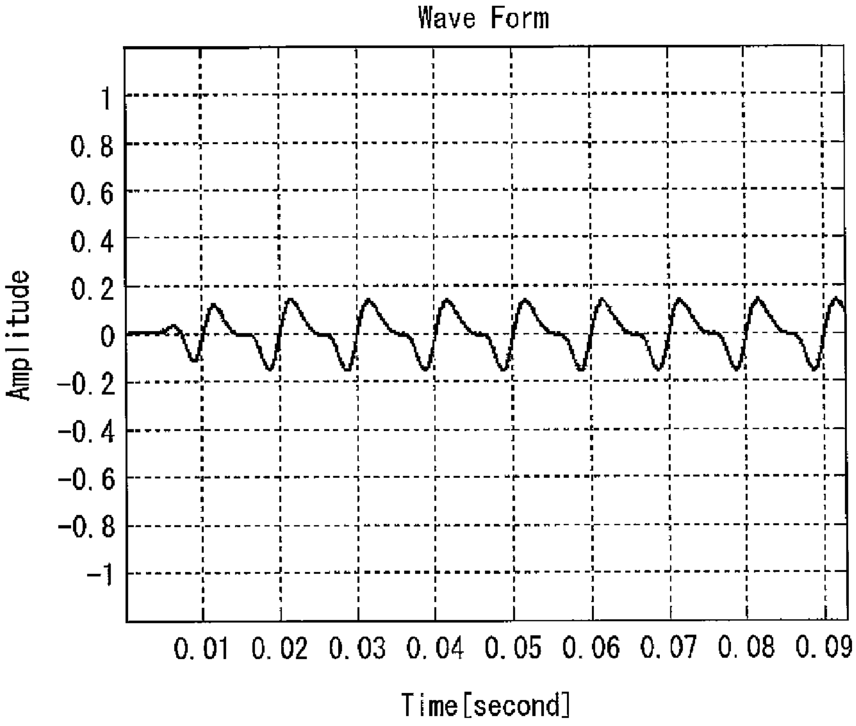
FIG. 11(*a*), showing another Example of the present invention, is a waveform chart illustrating a signal waveform of a low frequency signal having passed through the low-pass filter.
Figure 11:
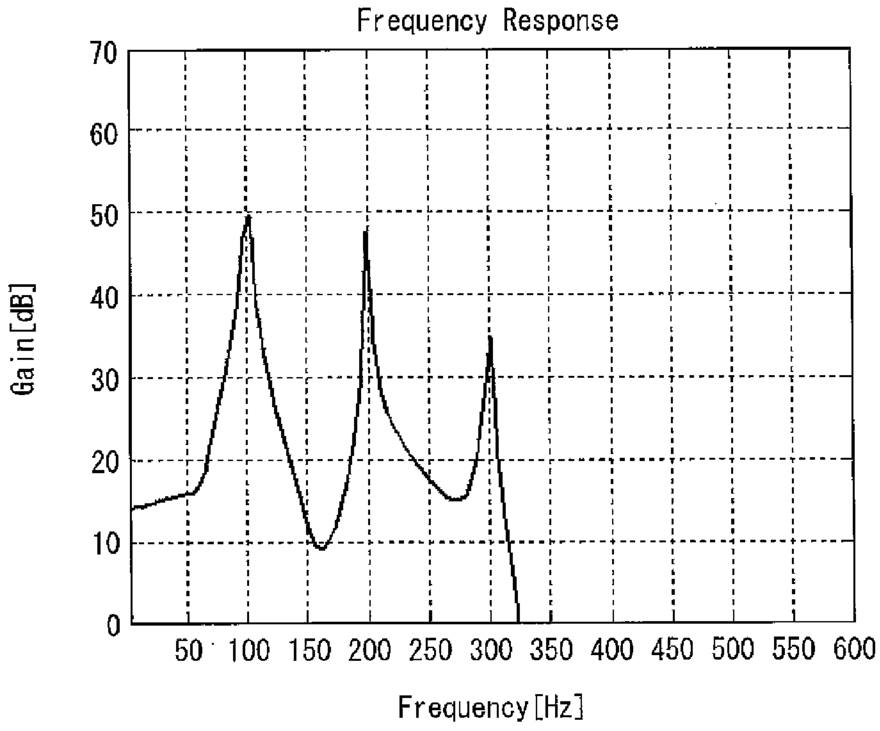

FIG. 11(*a*) is a waveform chart illustrating a waveform of the low frequency signal #5 whose high frequency component has been attenuated by the low-pass filter 123. FIG. 11(*b*) is a graph illustrating a frequency characteristic of the lower frequency signal #5. As apparent from FIG. 11(*b*), the low-pass filter 122 allows unnecessary high harmonics, specifically, the fifth or further harmonics to be removed from the low frequency signal #4.

Figure 12:
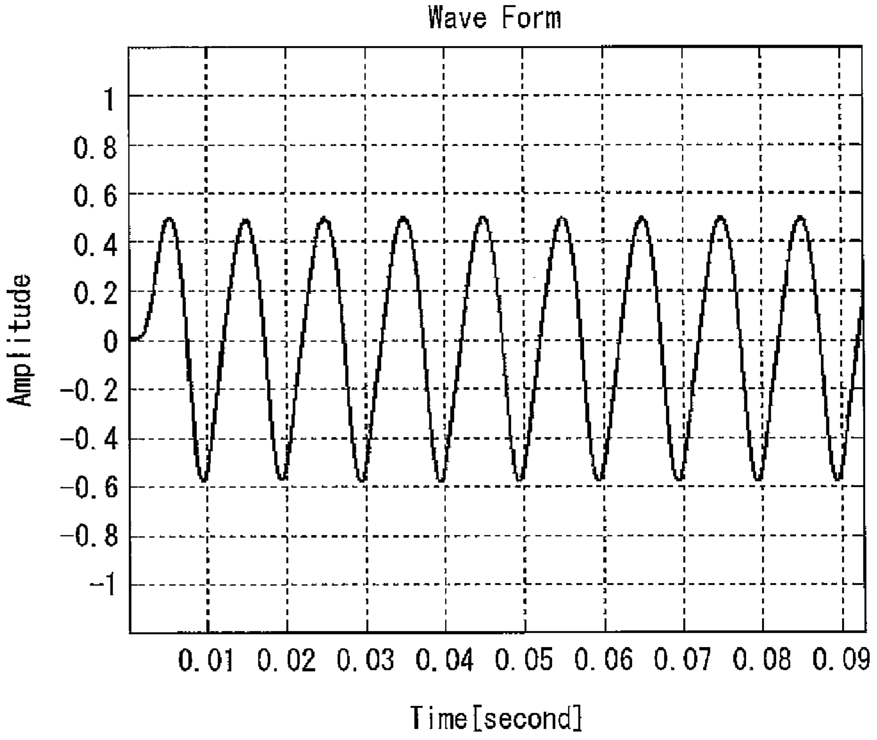
FIG. 12(*a*), showing another Example of the present invention, is a waveform chart illustrating a signal waveform of a low frequency signal having been added by an adder.
Figure 12:
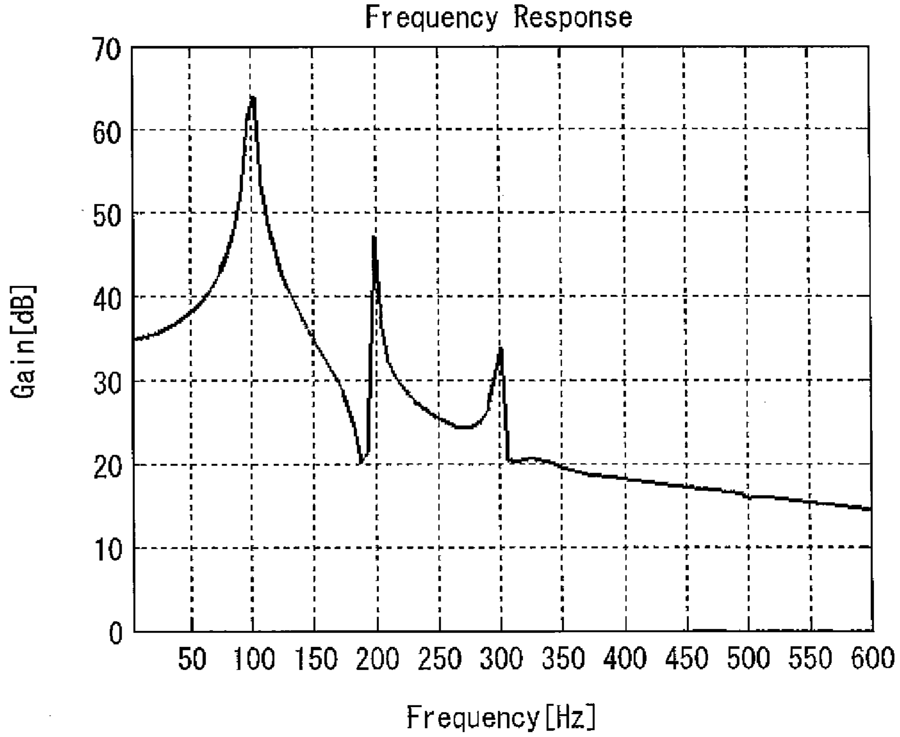

FIG. 12(*a*) is a waveform chart illustrating a waveform of the low frequency signal #6 having been obtained by adding the low frequency signal #5 to the low frequency signal #2 with the adder 125. FIG. 12(*b*) is a graph illustrating a frequency characteristic of the low frequency signal #6. As apparent from FIG. 12(*b*), the low frequency signal #6 outputted by the harmonics addition section 120 becomes a low frequency signal obtained by adding first, second, and third harmonics to the low frequency signal #2 having been inputted to the harmonics addition section 120.

(Effect Given by the Harmonics Addition Section)

In case where the harmonics addition section 120 of FIG. 2 is arranged so that a full-wave rectification section for carrying out full-wave rectification is provided instead of the half-wave rectification section 121 for carrying out the half-wave rectification, harmonics which can be added are limited to the second or further harmonics. Thus, with respect to the low frequency signal #2 whose frequency is near to an upper limit of a pass band of the high-pass filter 111, the second or further harmonics are attenuated by the low-pass filter 123, so that it is impossible to obtain harmonics having sufficient amplitudes. This raises such a problem that the low frequency signal #2 cannot be emphasized with favorable balance throughout the pass band of the high-pass filter 111.

Figure 13:
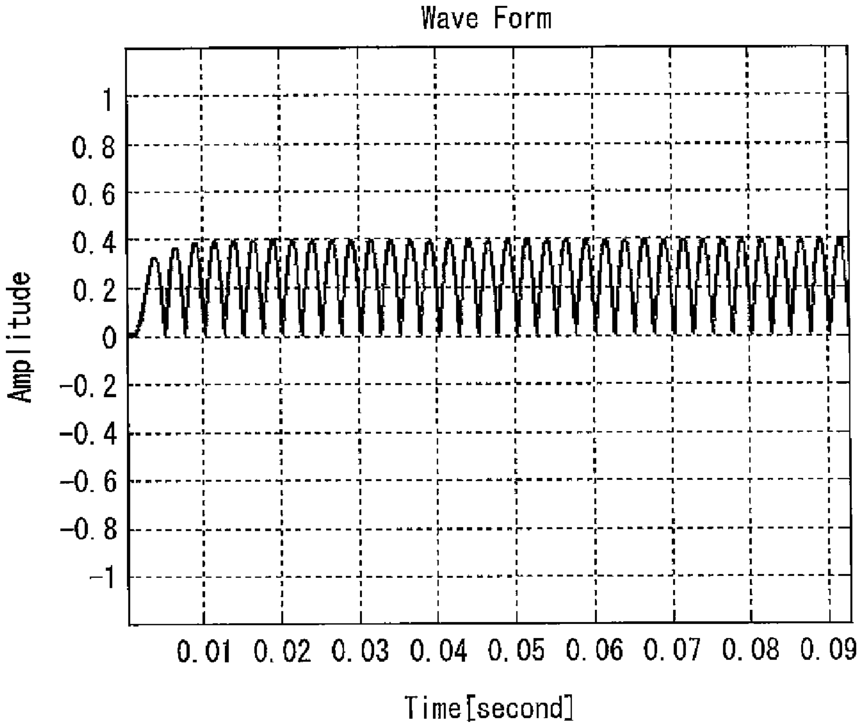
FIG. 13(*a*), showing a conventional art, is a waveform chart illustrating a signal waveform of a signal obtained by carrying out full-wave rectification with respect to an input signal of 200 Hz.
Figure 13:
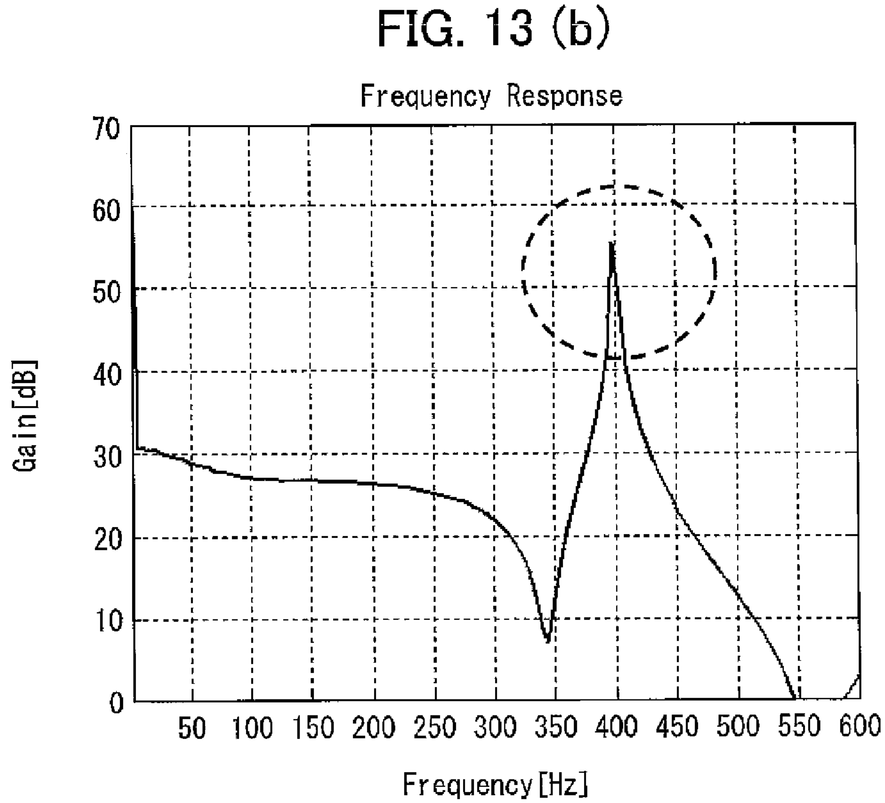
Figure 14:
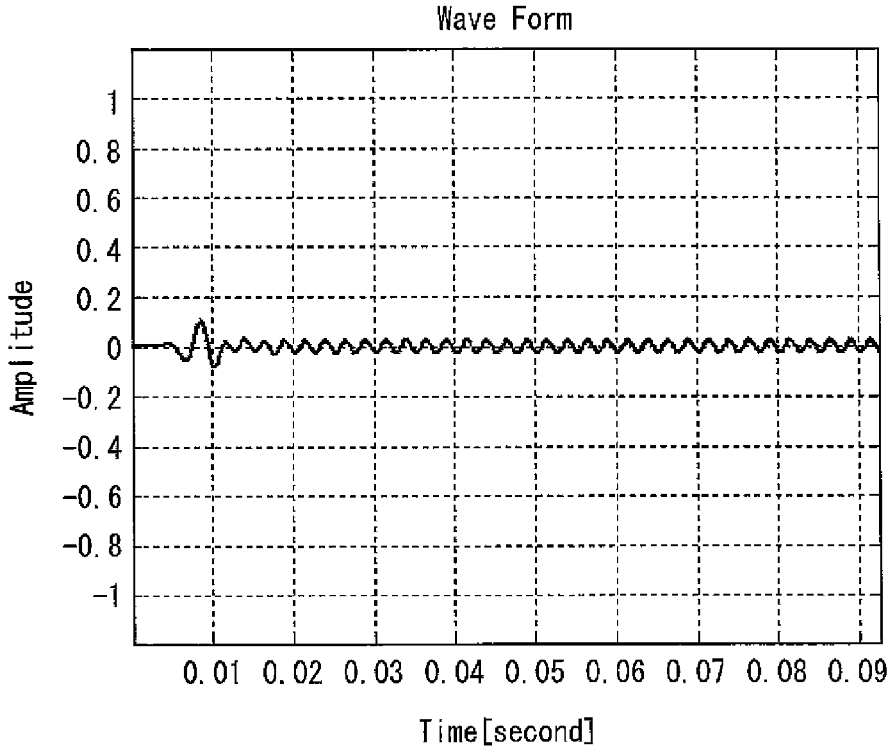
FIG. 14(*a*), showing an conventional art, is a waveform chart illustrating a signal having passed through a high-pass filter and a low-pass filter.
Figure 14:
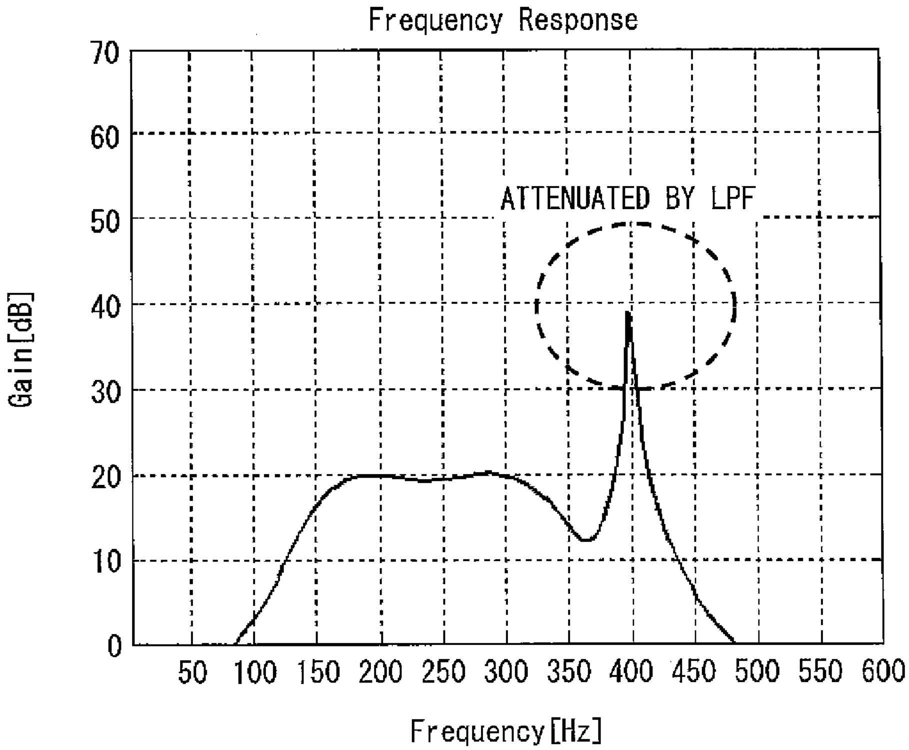

Each of FIG. 13 and FIG. 14 is a diagram illustrating the problem raised in case where the harmonics are added by the full-wave rectification.

FIG. 13(*a*) is a waveform chart illustrating a waveform of a 200 Hz input signal having been subjected to full-wave rectification. FIG. 13(*b*) is a graph illustrating a frequency characteristic of the input signal. As apparent from FIG. 13(*b*), the signal having subjected to the full-wave rectification contains a 400 Hz second harmonics and does not contain a 200 Hz fundamental wave.

FIG. 14(*a*) is a waveform chart illustrating a waveform of a signal having been obtained by causing the signal which is illustrated in FIG. 13(*a*) and FIG. 13(*b*) and which has been subjected to the full-wave rectification to pass through a high-pass filter cutoff frequency is 200 Hz and a low-pass filter whose cutoff frequency is 300 Hz. FIG. 14(*b*) is a graph illustrating a frequency characteristic of the signal. As apparent from FIG. 14(*b*), an amplitude of the second harmonics added by the full-wave rectification is attenuated by the low-pass filter. In this manner, with respect to an input signal whose frequency is near to the cutoff frequency of the low-pass filter, it is impossible to obtain a low frequency signal having sufficient bass.

While, according to the arrangement of the harmonics addition section 120 of FIG. 2, the harmonics are added by the half-wave rectification, so that it is possible to add harmonics containing a fundamental wave to the low frequency signal #2 having been inputted to the harmonics addition section 120. Thus, even if the second or further harmonics are attenuated by the low-pass filter 123, the presence of the fundamental wave prevents loss of the bass. Thus, the harmonics addition section 120 can emphasize the inputted low frequency signal #2 with favorable balance.

Figure 15:
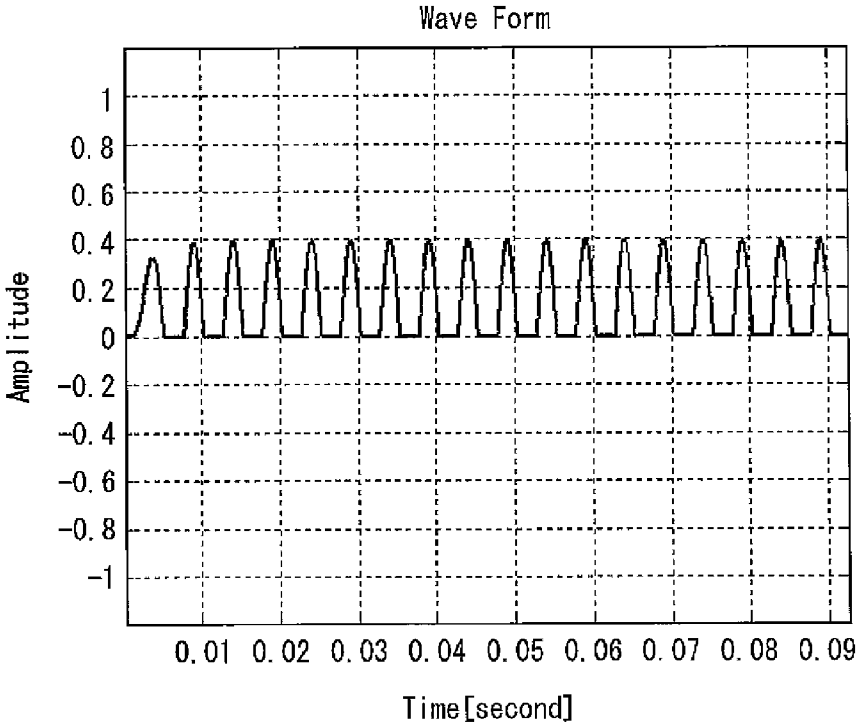
FIG. 15(*a*), showing an Example of the present invention, is a waveform chart illustrating a signal waveform of a signal obtained by carrying out half-wave rectification with respect to an input signal of 200 Hz.
Figure 15:
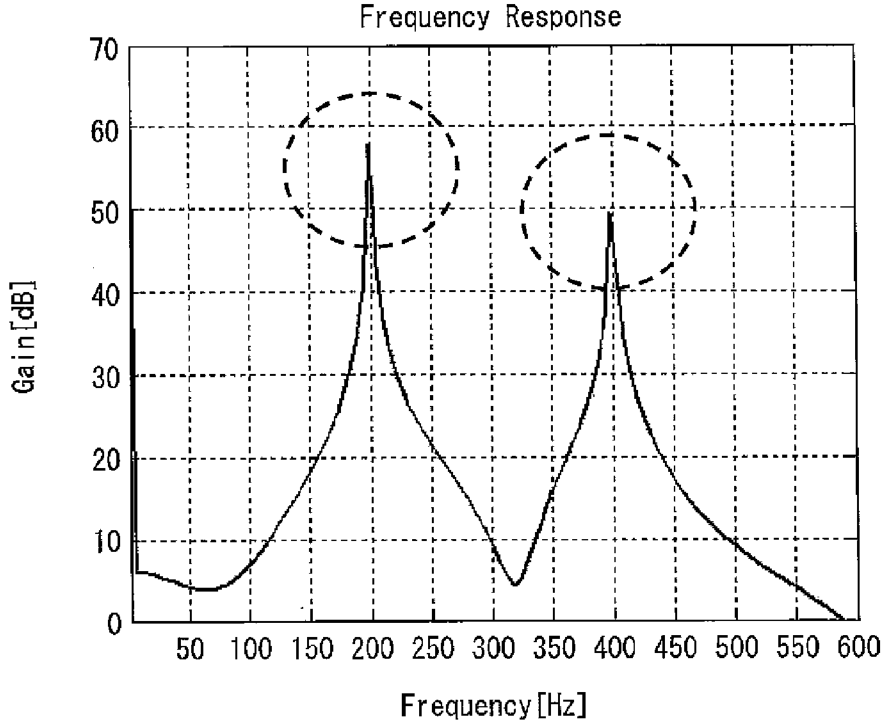
Figure 16:
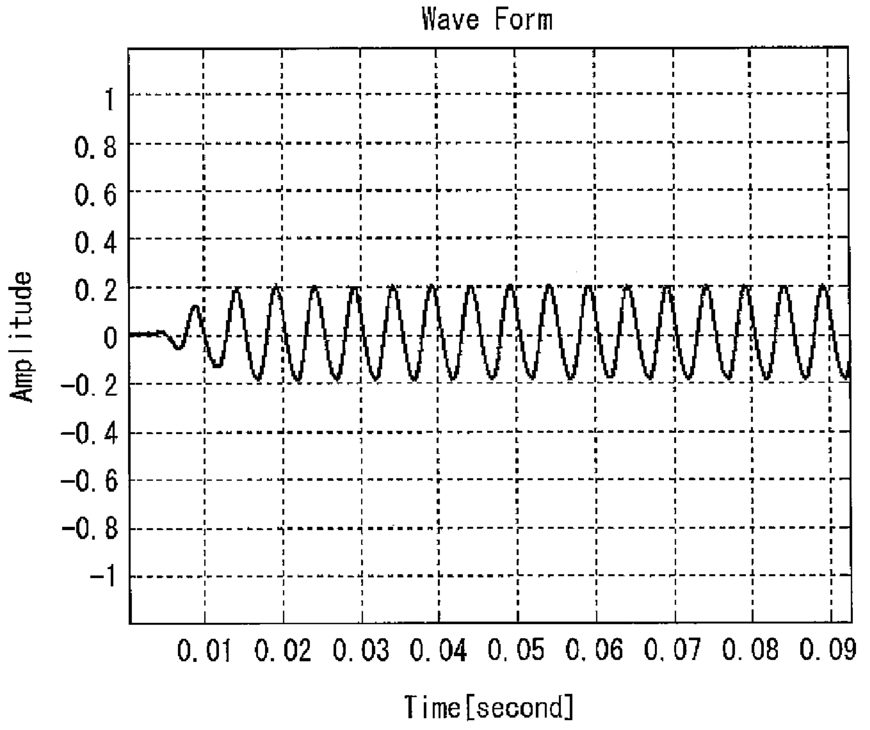
FIG. 16(*a*), showing an Example of the present invention, is a waveform chart illustrating a signal having passed through a high-pass filter and a low-pass filter.
Figure 16:
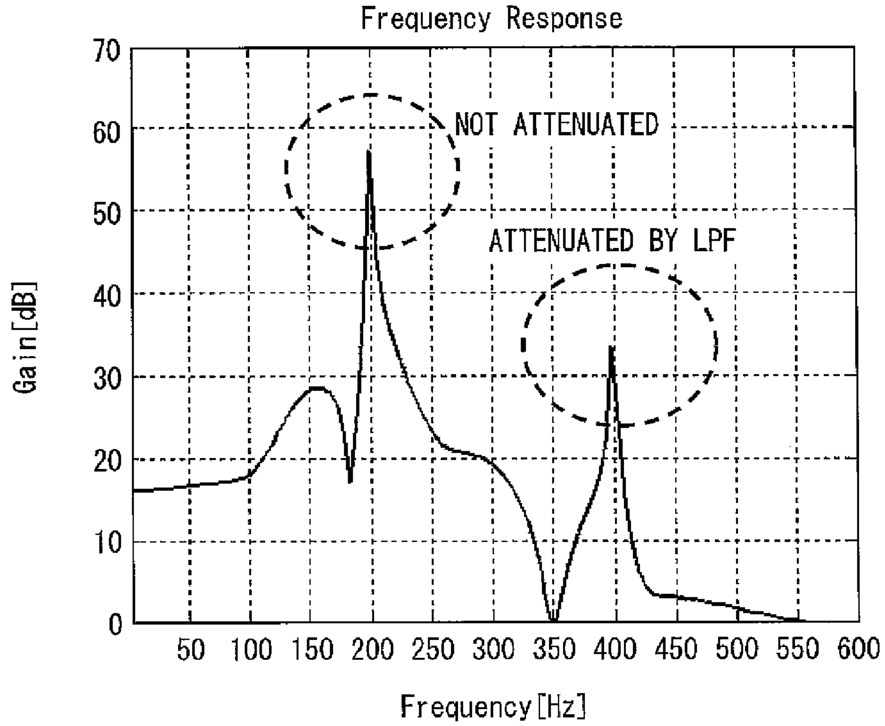

Each of FIG. 15 and FIG. 16 is a diagram for illustrating an advantage given in case where the harmonics are added by the half-wave rectification.

FIG. 15(*a*) is a waveform chart illustrating a waveform of a 200 Hz input signal having been subjected to half-wave rectification. FIG. 15(*b*) is a graph illustrating a frequency characteristic of the signal. As apparent from FIG. 15(*b*), the signal having subjected to the full-wave rectification contains a 200 Hz fundamental wave and a 400 Hz second harmonics.

FIG. 16(*a*) is a waveform chart illustrating a waveform of a signal obtained by causing the signal which is illustrated in FIG. 15(*a*) and FIG. 15(*b*) and which has been subjected to the half-wave rectification to pass through a high-pass filter cutoff frequency is 200 Hz and a low-pass filter whose cutoff frequency is 300 Hz. FIG. 16(*b*) is a graph illustrating a frequency characteristic of the signal. As apparent from FIG. 16(*b*), an amplitude of the second harmonics is attenuated by the low-pass filter, but an amplitude of the fundamental wave is not attenuated. In this manner, even with respect to an input signal whose frequency is near to the cutoff frequency of the low-pass filter, it is possible to obtain a low frequency signal having sufficient bass.

<Details of the Gain Control Section>

Next, with reference to FIG. 15 to FIG. 25, the gain control section 150 of the sound signal processing device 100 is detailed as follows.

(Gain Control of the Gain Control Section)

First, how the gain control is carried out by the gain control section 150 is explained as follows with reference to FIG. 17.

Figure 17:
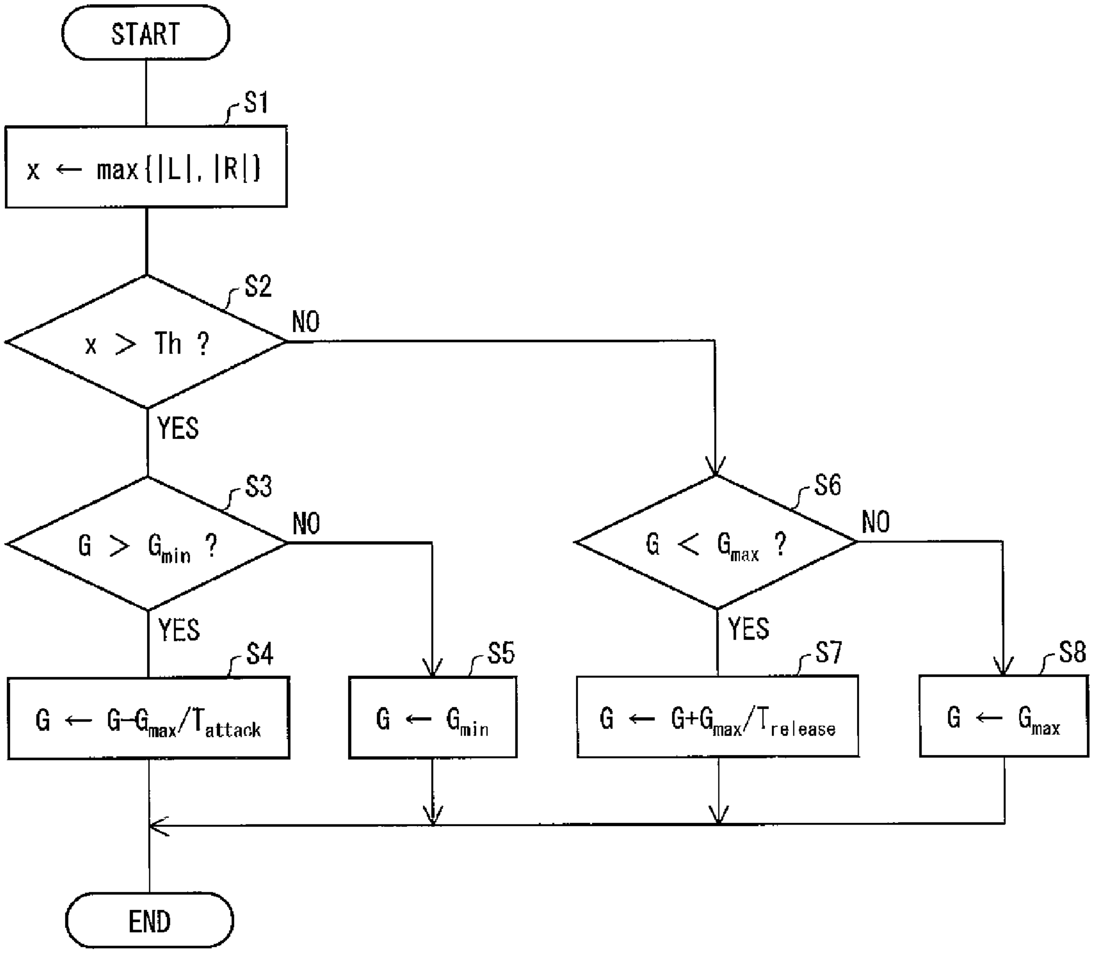
FIG. 17, showing an embodiment of the present invention, is a flowchart illustrating how a gain control section controls a gain.

FIG. 17 is a flowchart illustrating how the gain control is carried out by the gain control section 150. The gain control section 150 repetitively carries out a series of steps in the flowchart of FIG. 17 so as to control the gain of the low frequency signal amplification section 130 by stages. The steps in carrying out the gain control of the gain control section 150 are described as follows.

Step S1: The gain control section 150 calculates an absolute value of a left-channel value L of the output signal #9 outputted from the sound signal processing device 100 and an absolute value of a right-channel value R of the output signal #9 and selects a larger one of the two absolute values having been calculated, thereby determining an output level $X=\mathrm{Max}\{|L|,|R|\}$ of the output signal #9.

Step S2: Next, the gain control section 150 compares the output level X determined in the step S1 with a threshold value Th. In case where the output level X is larger than the threshold value Th (Yes in S2), the gain control section 150 decreases the gain of the amplifier 131 by carrying out the following steps S3 to S5. While, in case where the output level X is equal to or smaller than the threshold value Th (No in S2), the gain control section 150 increases the gain of the amplifier 131 by carrying out the following steps S6 to S8.

Step S3: In case where the output level X is determined as being larger than the threshold value Th in the step S2 (Yes in S2), the gain control section 150 compares a current gain G with a predetermined lower limit gain Gmin.

Step S4: In case where the current gain G is determined as being larger than the lower limit gain Gmin in the step S3 (Yes in S3), the gain control section 150 sets the gain G of the amplifier 131 to such a value that G-Gmax/Tattack which is smaller than the current gain G by Gmax/Tattack. Herein, Gmax is a predetermined upper limit value, and Tattack is a predetermined attack time.

Step S5: In case where the current gain G is determined as being equal to or smaller than the lower limit gain Gmin in the step S3 (No in S3), the gain control section 150 sets the gain of the amplifier 131 to the lower limit gain Gmin so as to finish decreasing the gain.

Step S6: In case where the output level X is determined as being equal to or smaller than the threshold value Th in the step S2 (No in S2), the gain control section 150 compares the current gain G with the predetermined upper limit gain Gmax.

Step S7: In case where the current gain G is determined as being smaller than the upper limit Gmax in the step S6 (Yes in S6), the gain control section 150 sets the gain G of the amplifier 131 to such a value that G+Gmaz/Trelease which is larger than the current gain G by Gmax/Tfelease. Herein, Trelease is a predetermined release time.

Step S8: In case were the current gain G is determined as being equal to or larger than the upper limit Gmax in the step S6 (No in S6), the gain control section 150 sets the gain G of the amplifier 131 to the upper limit Gmax so as to finish increasing the gain.

Note that, the flowchart of FIG. 17 is based on a case where Gmax>0 (in case where the gain of the amplifier 131 has a positive value). However, in case where Gmax<0 (in case where the gain of the amplifier 131 has a value equal to or less than 0, i.e., in case of the attenuator), the gain G may be decreased by |Gmin|/Tattack or (Gmax-Gmin)/Tattack in the step S4, and the gain G may be increased by |Gmin|/Trelease or (Gmax-Gmin)/Trelease in the step S7. Alternatively, it may be so arranged that the gain is always max>0 in terms not of decibel unit but of a ratio (=10 (gain/20)).

Figure 18:
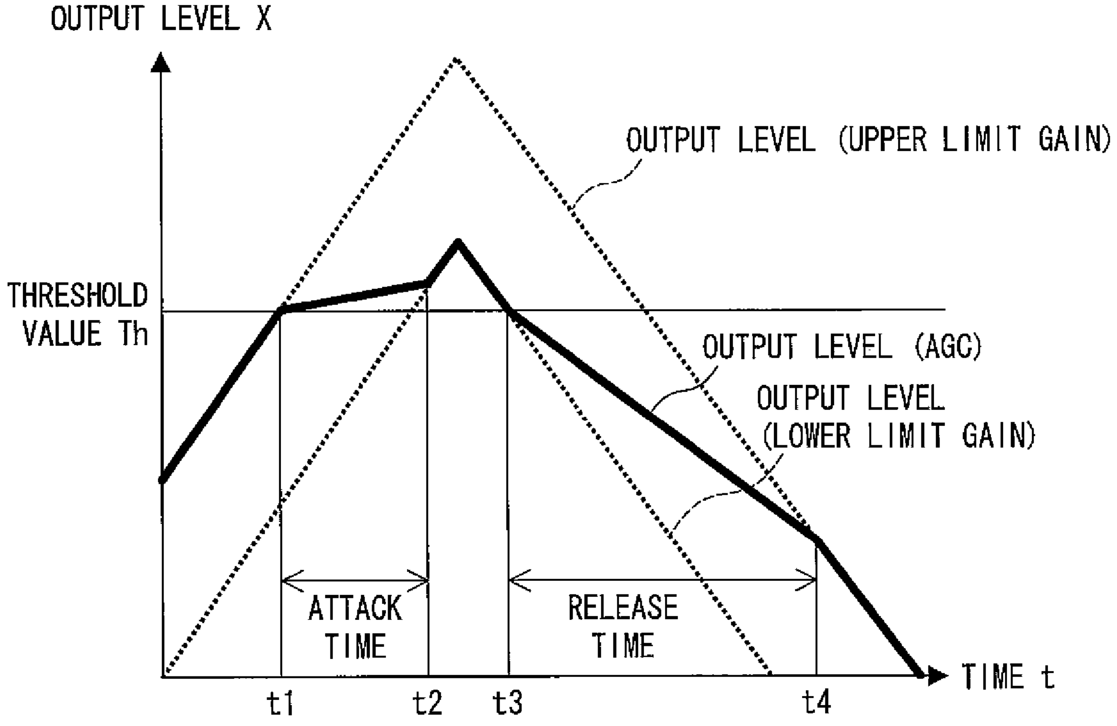
FIG. 18, showing an embodiment of the present invention, is a graph illustrating how an output level of an output signal of the sound signal processing device varies with time passage.

FIG. 18 is a graph illustrating how the output level X of the output signal #9 varies with time passage. In the graph of FIG. 18, a horizontal axis indicates a time and a vertical axis indicates the output level X of the output signal #9.

As illustrated in FIG. 18, when the output level X of the output signal #9 attains the threshold value Th at time t1, the gain control section 150 gradually decreases the gain G of the amplifier 131 during a period from time t1 to time t2. More specifically, every time the series of steps illustrated in FIG. 17 is carried out, the gain of the amplifier 131 is decreased by Gmax/Tattack. Herein, time t2 at which decrease of the gain G is finished corresponds to a time when the gain G of the amplifier 131 attains the lower limit gain Gmin. Further, the gain control section 150 keeps the gain G of the amplifier 131 at the lower limit gain Gmin for a period from time t2 to time t3. Herein, the time t3 is a time when the output level X attains the threshold value Th. Further, the gain control section 150 gradually increases the gain of the amplifier 131 for a period from time t3 to time t4. More specifically, every time the series of steps illustrated in FIG. 17 is carried out, the gain G of the amplifier 131 is increased by Gmax/Trelease. Herein, time t4 is a time when the gain G of the amplifier 131 attains the upper limit gain Gmax. Thereafter, the gain G of the amplifier 131 is kept at the upper limit gain Gmax until a time when the output level X attains the threshold Th again.

Figure 19:
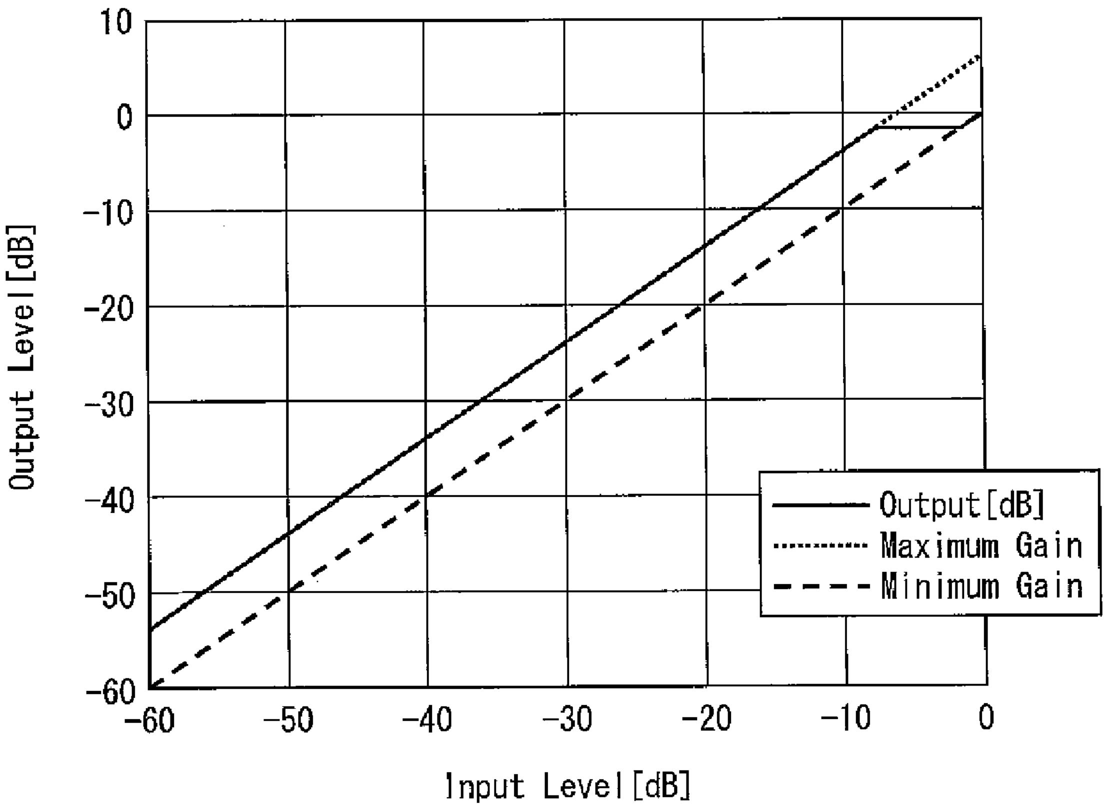
FIG. 19, showing an embodiment of the present invention, is a waveform chart illustrating a relation between an input level and an output level in the sound signal processing device.

FIG. 19 is a graph illustrating a relation between an input level of the low frequency signal #7 inputted to the amplifier 131 and an output level of the output signal #9 outputted from the sound signal processing device 100. Herein, the upper limit gain Gmax is set to 6 dB, and the lower limit gain Gmin is set to 0 dB, and the threshold value Th is set to −1.5 dB. As apparent from FIG. 19, when the output level of the output signal #9 is equal to or lower than the threshold value Th, the lower frequency signal #7 inputted to the amplifier 131 is amplified so that the gain is the upper limit gain Gmax. Further, when the output level of the output signal #9 is higher than the threshold value Th, the low frequency signal #7 inputted to the amplifier 131 is amplified so that the gain is the lower limit gain Gmin.

(Example of the Gain Control of the Gain Control Section)

With reference to FIG. 20 to FIG. 24, Example of the gain control of the gain control section 150 of FIG. 17 is described as follows. In the following Example, the threshold value Th, the upper limit gain Gmax, the lower limit gain Gmin, the attack time Tattack, and the release time Trelease are set as shown in the following Table.

| Item | Set value |
|---|---|
| Threshold value | −1.5 dB |
| Upper limit gain Gmax | 6 dB |
| Lower limit gain Gmin | 0 dB |
| Attack time Tattack | 5 ms |
| Release time Trelease | 500 ms |

Figure 20:
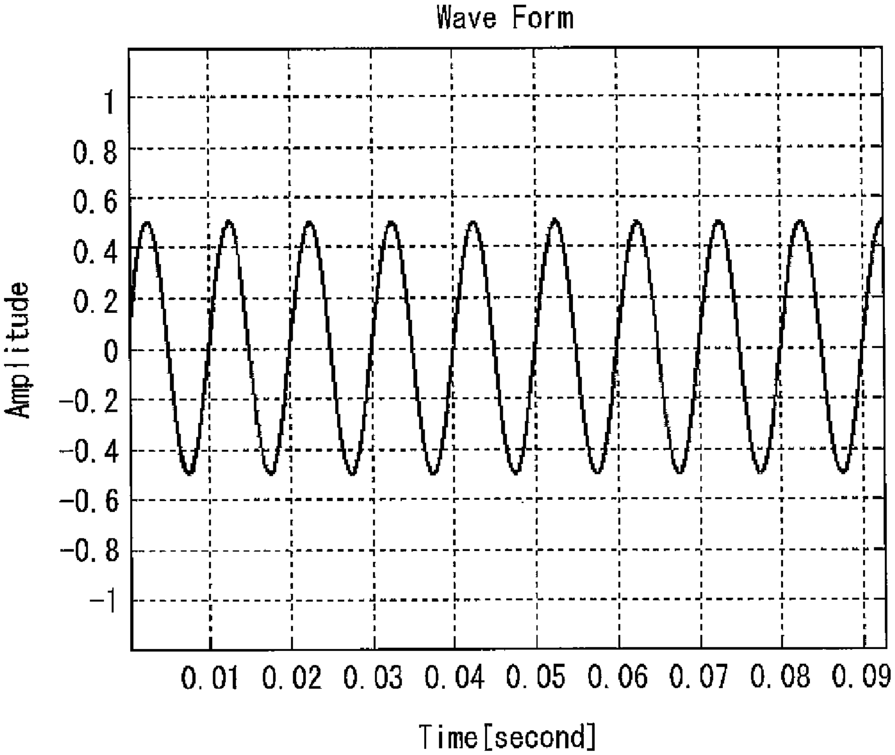
FIG. 20(*a*), showing an Example of the present invention, is a waveform chart illustrating a sound signal inputted to the sound signal processing device.
Figure 20:
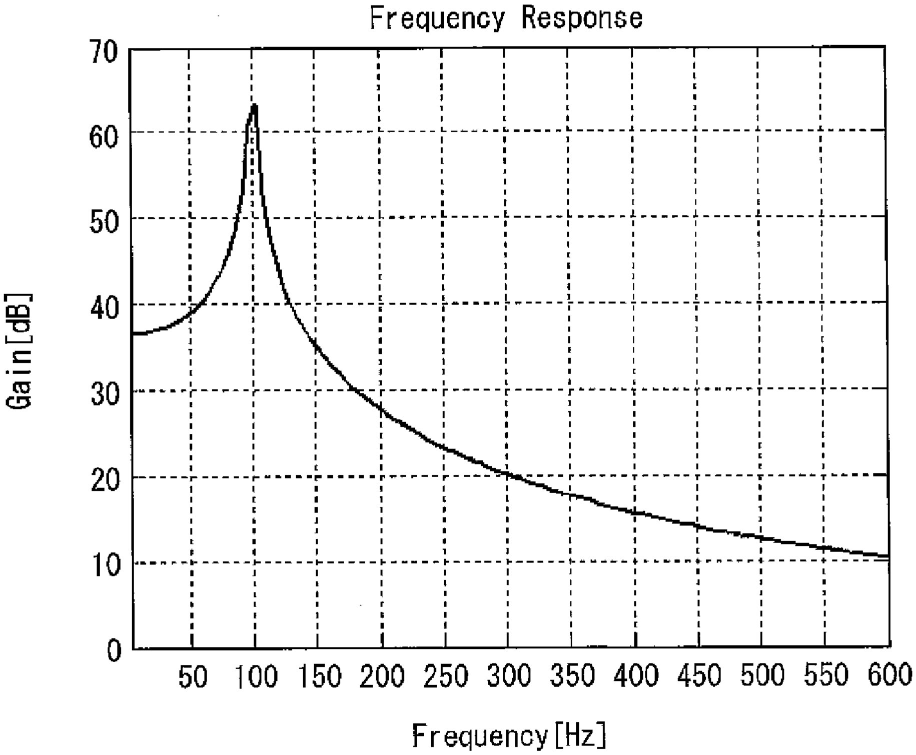

First, a sound signal #1 constituted only of a low frequency component (center frequency is 100 Hz) is inputted to the sound signal processing device 100. FIG. 20(*a*) is a waveform chart illustrating a waveform of the sound signal #1 inputted to the sound signal processing device 100. FIG. 20(*b*) is a graph illustrating a frequency characteristic of the sound signal #1.

Figure 21:
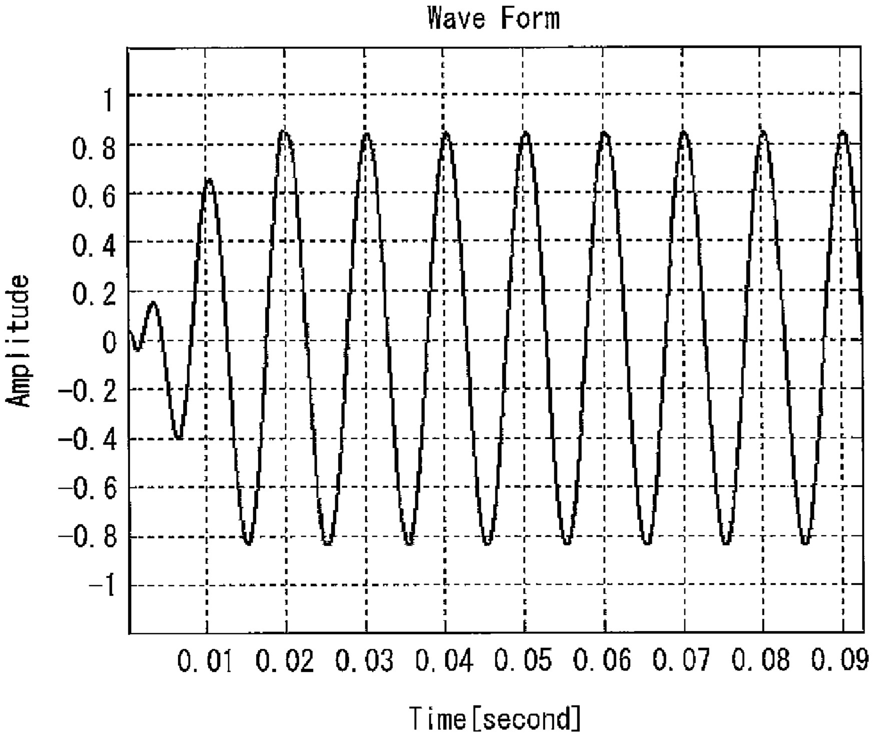
FIG. 21(*a*), showing an Example of the present invention, is a waveform chart illustrating a signal waveform of an output signal obtained by inputting the sound signal illustrated in FIG. 20(*a*) and FIG. 20(*b*) into the sound signal processing device.
Figure 21:
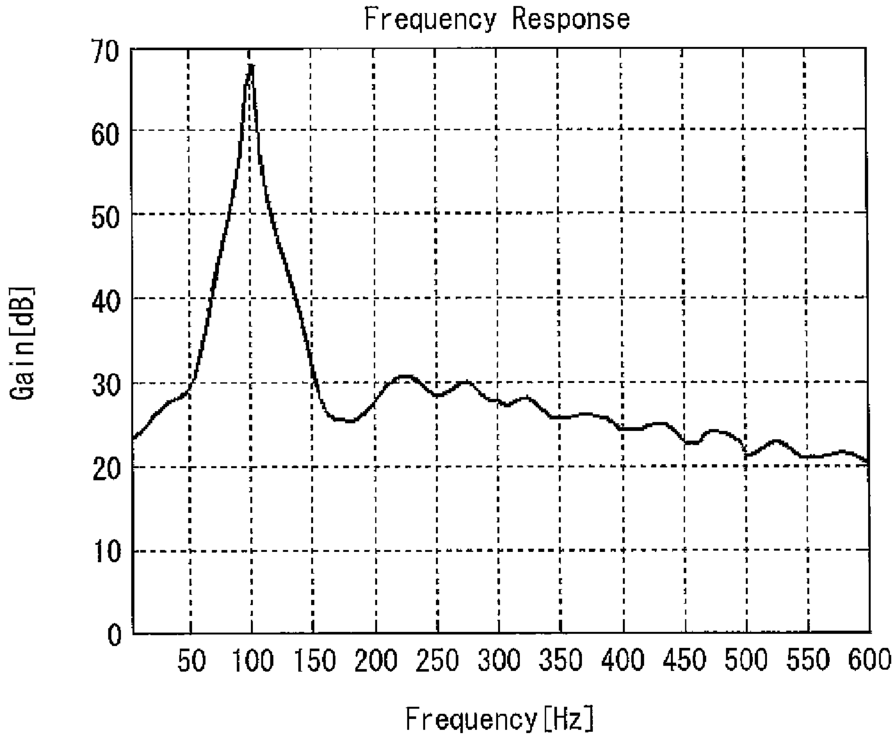

FIG. 21(*a*) is a waveform chart illustrating a signal waveform of the output signal #9 which has been obtained by inputting the sound signal 31 shown in FIG. 20(*a*) and FIG. 20(*b*) into the sound signal processing device 100. FIG. 21(*b*) is a graph illustrating a frequency characteristic of the output signal #9.

As apparent from FIG. 21(*a*), the output signal #9 attains a stationary state in such a short time as about 0.02 seconds. That is, the output signal #9 has a small amplitude at the beginning of input, but the amplitude becomes gradually larger with time passage and attains a certain value in about 0.02 seconds. This is because an IIR type high-pass filter is used as the high-pass filter 126. Further, the inputted sound signal #1 has an amplitude of 0.5, but the amplitude increases to 0.84 in the stationary state. That is, a gain of about 4.5 dB is obtained.

Note that, in FIG. 20(*a*) and FIG. 21(*a*), the amplitude is standardized so that the clip level of the D/A converter connected to the following stage of the sound signal processing device 100 is 1. That is, the amplitude of the output signal #9 of FIG. 21(*a*) is kept at a level equal to or lower than the clip level of the D/A converter.

Figure 22:
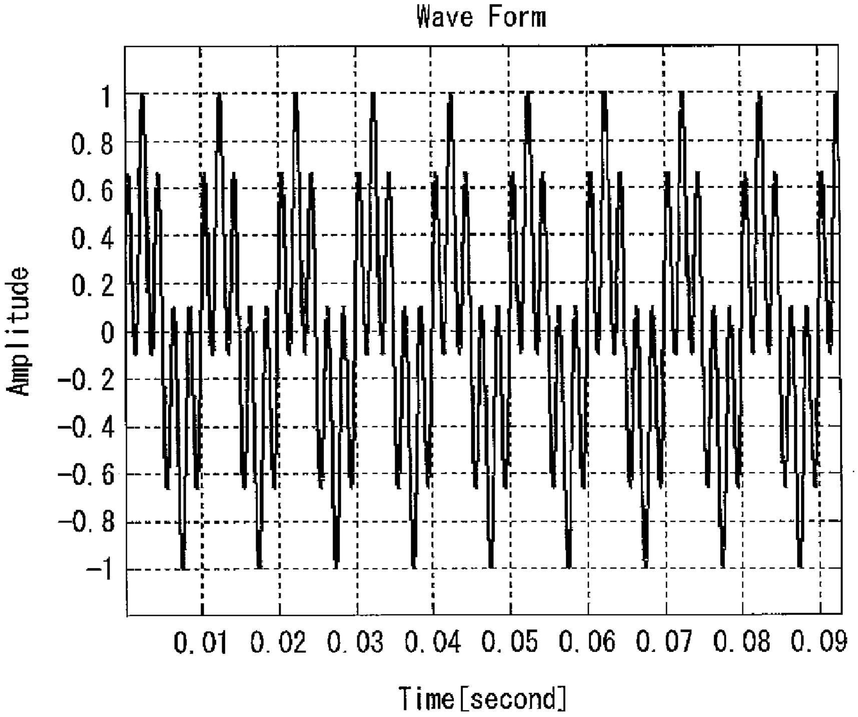
FIG. 22(*a*), showing another Example of the present invention, is a waveform chart illustrating a signal waveform of a sound signal inputted to the sound signal processing device.
Figure 22:
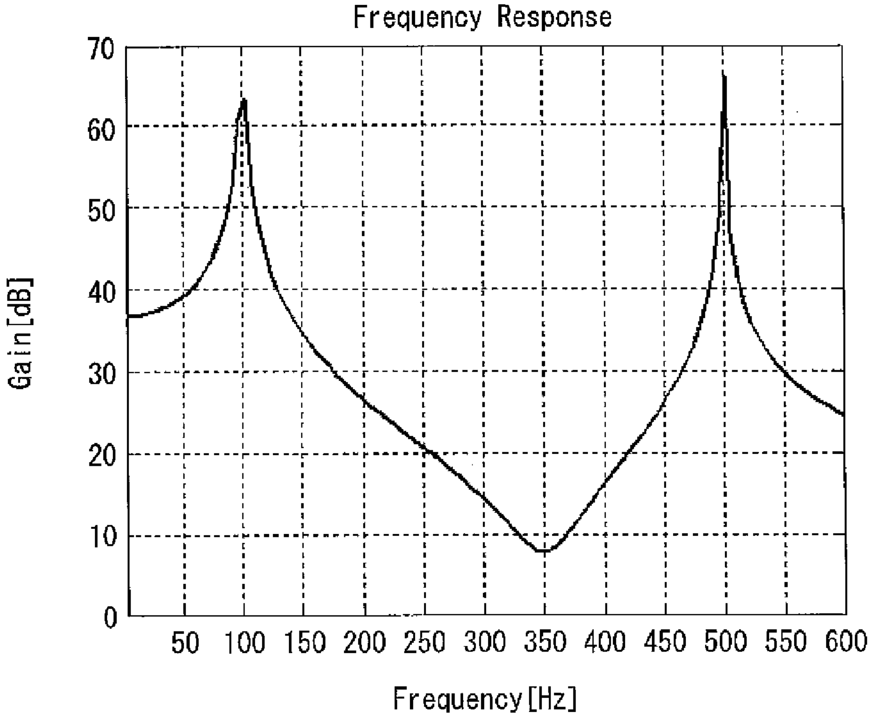

Next, the sound signal #1 constituted of a low frequency component (center frequency is 100 Hz) and a middle frequency component (center frequency is 500 Hz) is inputted to the sound signal processing device 100. FIG. 22(*a*) is a waveform chart illustrating a waveform of the sound signal #1 inputted to the sound signal processing device 100. FIG. 22(*b*) is a graph illustrating a frequency characteristic of the sound signal #1. The sound signal #1 corresponds to a sound signal indicative of (i) a speech of an actor (middle frequency component) and (ii) an explosive sound (low frequency component) that are generated at the same time. Herein, an amplitude of each of the low frequency component and the middle frequency component was set to 0.5 so that a maximum amplitude of the sound signal #1 corresponded to the clip level of the D/A converter.

Figure 23:
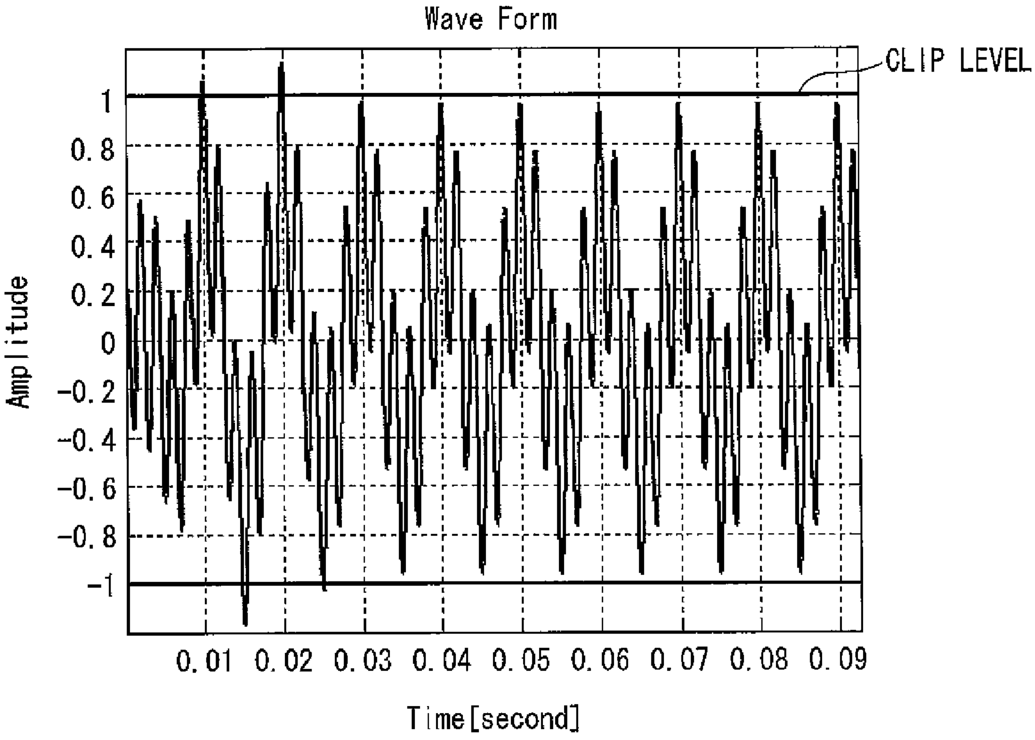
FIG. 23(*a*), showing another Example of the present invention, is a waveform chart illustrating a signal waveform of an output signal obtained by inputting the sound signal illustrated in FIG. 22(*a*) and FIG. 22(*b*) into the sound signal processing device.
Figure 23:
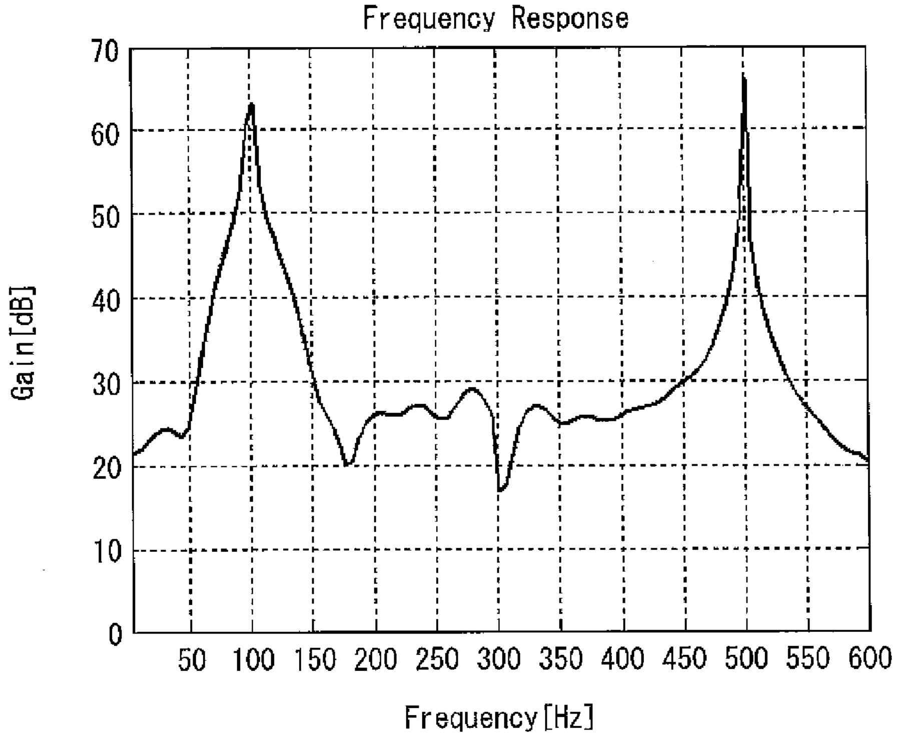

FIG. 23(*a*) is a waveform chart illustrating a signal waveform of the output signal #9 which has been obtained by inputting the sound signal #1 shown in FIG. 22(*a*) and FIG.

22(*b*) into the sound signal processing device 100. FIG. 23(*b*) is a graph illustrating a frequency characteristic of the output signal #9.

As apparent from FIG. 23(*a*), a maximum amplitude of the output signal #9 is kept at a level equal to or lower than the clip level of the D/A converter in the stationary state. Since the gain control section 150 carries out the gain control in accordance not with the low frequency signal #8 outputted from the amplifier 131 but with the output signal #10 containing a middle frequency component, the maximum amplitude of the output signal #9 can be kept at a level equal to or lower than the clip level of the D/A converter in the foregoing manner.

Further, as apparent from FIG. 23(*b*), an amplitude of the middle frequency component in the output signal #9 is kept at about 0.5 equal to the middle frequency component of the input signal #1. That is, also when the low frequency component like explosive sound is contained in the sound signal #1, there is no attenuation in the amplitude of the middle frequency component like speech of an actor, that is, there is no "unstable volume" in the middle frequency component. Since the gain control section 150 controls the gain of the amplifier 131 which does not amplitude an entire band of the sound signal #1 but amplifies only the low frequency signal, the amplitude of the middle frequency component in the output signal #9 can be kept at the same level as the amplitude of the input signal #1.

Figure 24:
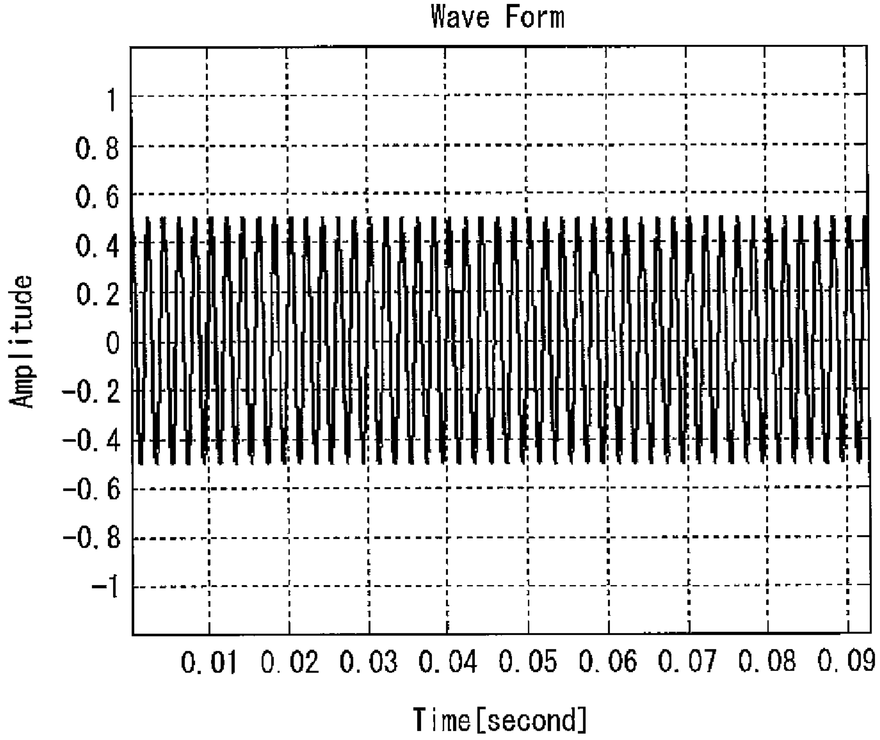
FIG. 24(*a*), showing another Example of the present invention, is a waveform chart illustrating a signal waveform of a sound signal inputted to the sound signal processing device.
Figure 24:
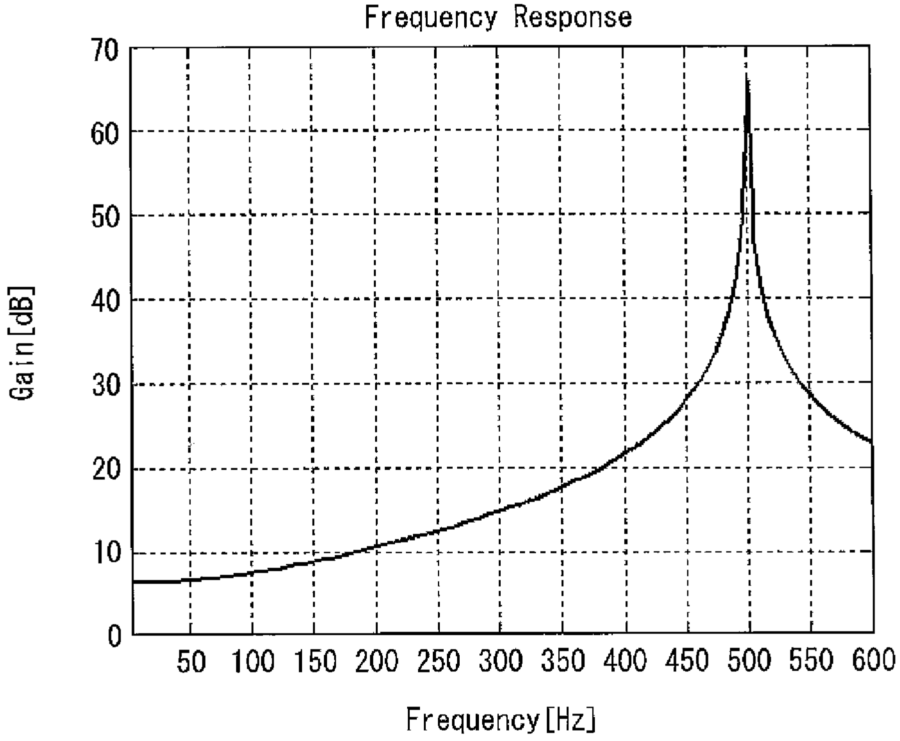

Lastly, the sound signal #1 constituted only of a middle frequency component (center frequency is 500 Hz) is inputted to the sound signal processing device 100. FIG. 24(*a*) is a waveform chart illustrating a signal waveform of the sound signal #1 inputted to the sound signal processing device 100. FIG. 24(*b*) is a graph illustrating a frequency characteristic of the sound signal #1.

Figure 25:
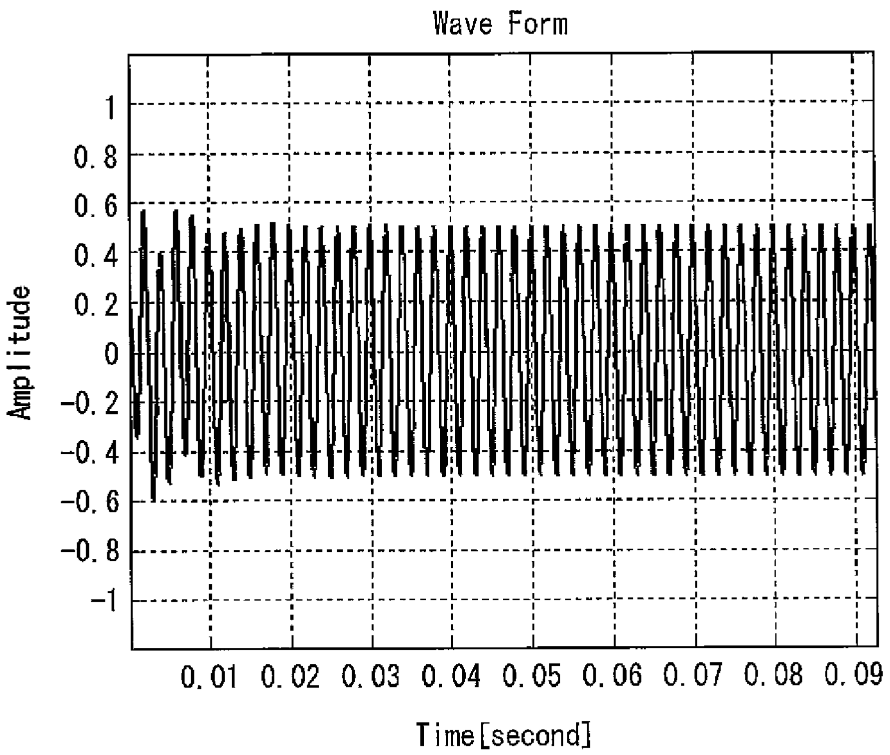
FIG. 25(*a*), showing another Example of the present invention, is a waveform chart illustrating a signal waveform of an output signal obtained by inputting the sound signal illustrated in FIG. 24(*a*) and FIG. 24(*b*) into the sound signal processing device.
Figure 25:
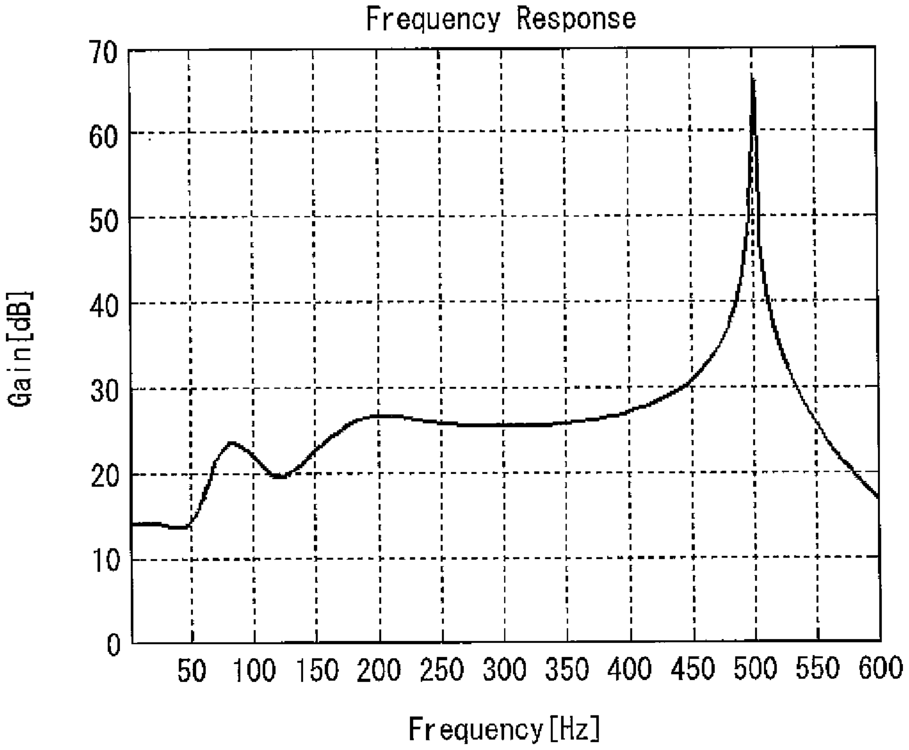

FIG. 25(*a*) is a waveform chart illustrating a signal waveform of the output signal #9 which has been obtained by inputting the sound signal #1 shown in FIG. 24(*a*) and FIG. 24(*b*) into the sound signal processing device 100. FIG. 24(*b*) is a graph illustrating a frequency characteristic of the output signal #9. As shown in FIG. 25(*a*) and FIG. 25(*b*), an amplitude of the middle frequency of the output signal #9 is kept at about 0.5 equal to an amplitude of the middle frequency component of the input signal #1.

<Low Frequency Component Attenuation Means>

The sound signal processing device 100 includes the high-pass filter 126 as low frequency component attenuation means for attenuating a low frequency component which is contained in the low frequency signal #6 inputted to the low frequency signal amplification section 130 and which is equal to or lower than a predetermined frequency. The high-pass filter 126 is further detailed as follows.

The predetermined frequency, i.e., a cutoff frequency of the high-pass filter 126 is set to a reproducible lower limit frequency of a speaker for outputting the sound signal processed by the sound signal processing device 100 as a sound wave for example. As a result, the low frequency signal #7 from which a low frequency component equal to or lower than the reproducible lower limit frequency of the speaker has been removed is amplified by the lower frequency signal amplification section 130.

As a result, it is possible to avoid increase of an output level of the output signal #9 which is caused by a low frequency component which cannot be reproduced by the speaker. Thus, it is possible to set the gain of the amplifier 131 to be higher than the case where the high-pass filter 126 is not provided, so that it is possible to further emphasize the bass.

Figure 26:
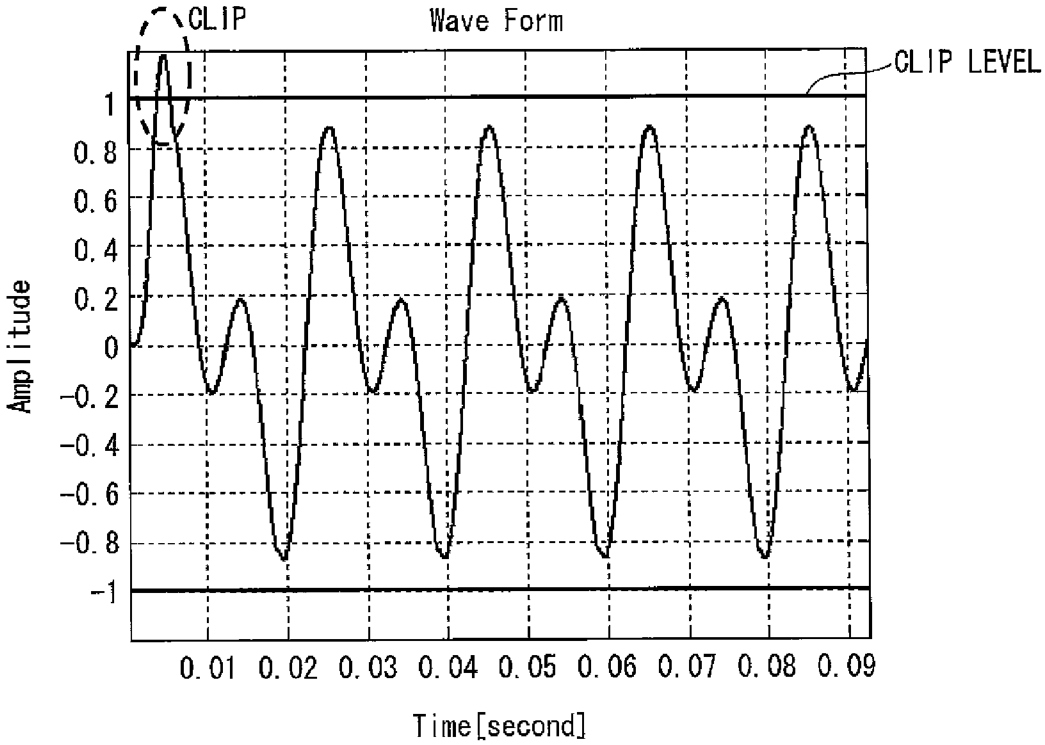
FIG. 26(*a*) is a waveform chart illustrating a signal waveform of a signal obtained by amplifying a sound signal, containing a super-low frequency component and a low frequency component, not via a high-pass filter.
Figure 26:
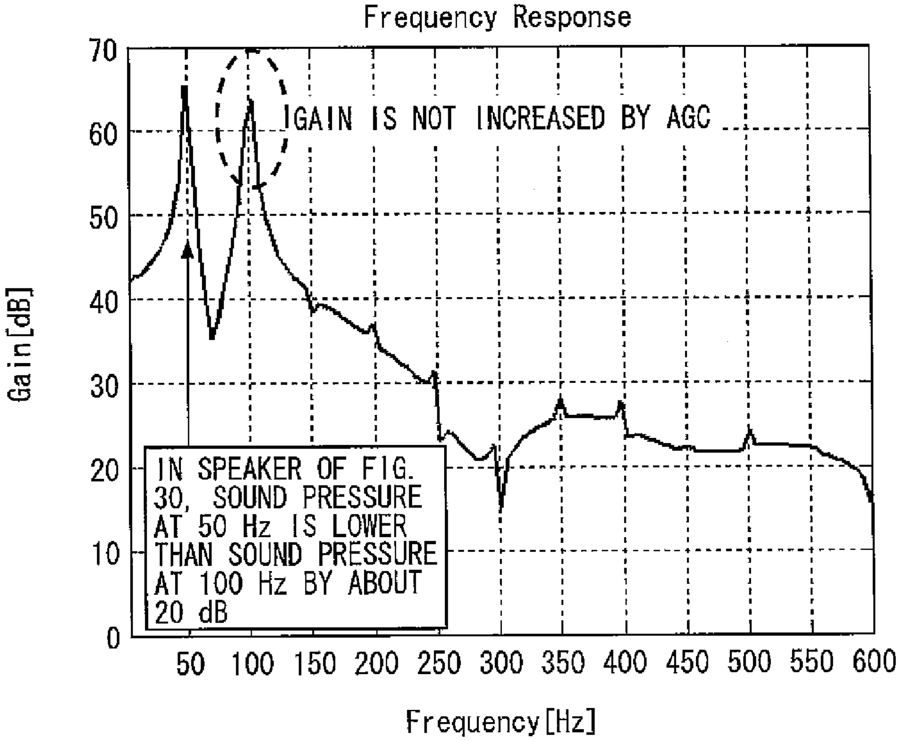

FIG. 26(*a*) is a waveform chart illustrating a waveform of the output signal #8 of the low frequency signal amplification section 130, which has been obtained by a sound signal constituted of a super low frequency component of 50 Hz and a low frequency component of 100 Hz into the sound signal processing device 100 from which the high-pass filter 126 has been removed. FIG. 26(*b*) is a graph illustrating a frequency characteristic of the output signal #8 in a stationary state.

In case where the high-pass filter 126 is removed, an amplitude of the output signal #8 exceeds the clip level in a transition state as apparent from FIG. 26(*a*), so that the gain control section 150 decreases the gain of the amplifier 131. Thus, also an amplitude of the super low frequency component lower than the reproducible lower limit frequency (herein, 100 Hz) of the speaker decreases as well as an amplitude of the low frequency component of the reproducible lower limit frequency of the speaker.

Figure 27:
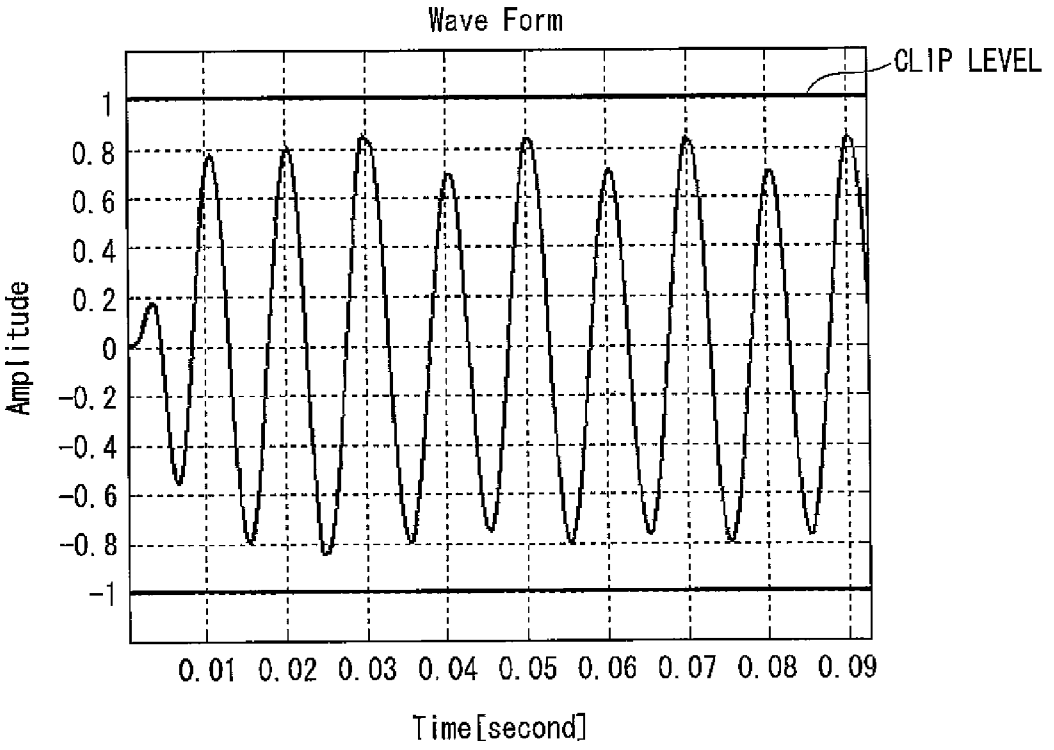
FIG. 27(*a*) is a waveform chart illustrating a signal waveform of a signal obtained by amplifying a sound signal, containing a super-low frequency component and a low frequency component, via a high-pass filter.
Figure 27:
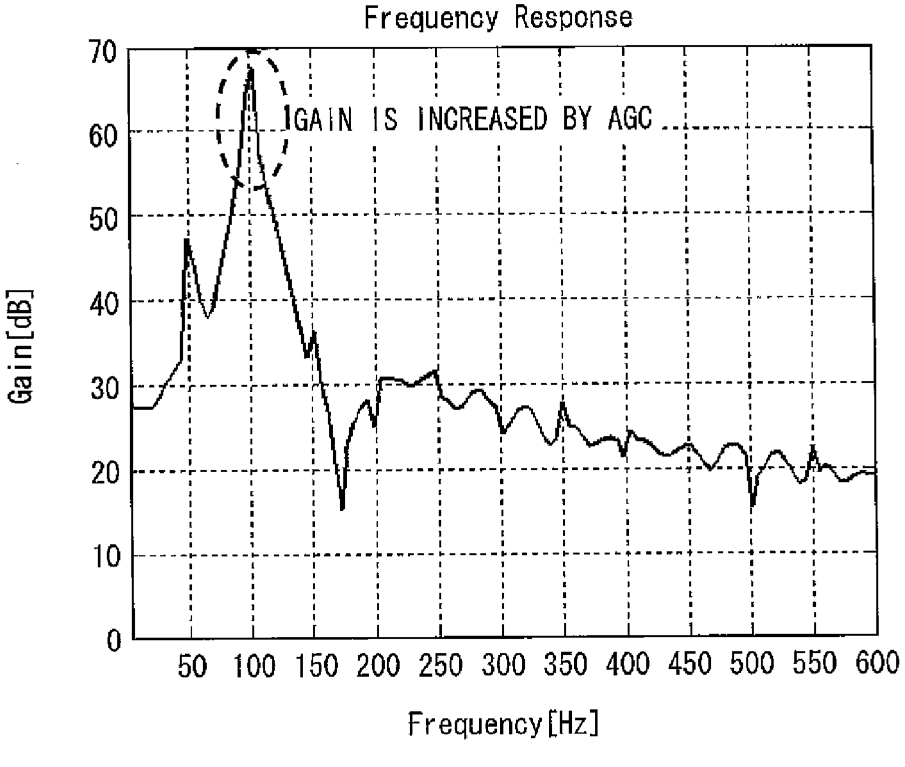

FIG. 27(*a*) is a waveform chart illustrating a waveform of the output signal #8 of the low frequency signal amplification section 130, which has been obtained by inputting a sound signal constituted of a super low frequency component of 50 Hz and a low frequency component of 100 Hz into the sound signal processing device 100 having the high-pass filter 126. FIG. 27(*b*) is a graph illustrating a frequency characteristic of the output signal #8 in a stationary state.

In case where the high-pass filter 126 is provided, an amplitude of the output signal #8 is less than the clip level as shown in FIG. 26(*a*), so that the gain control section 150 increases the gain of the amplifier 131. Thus, an amplitude of the low frequency component of 100 Hz equal to or higher than the reproducible lower limit frequency of the speaker can be made larger.

Embodiment 2

Figure 28:
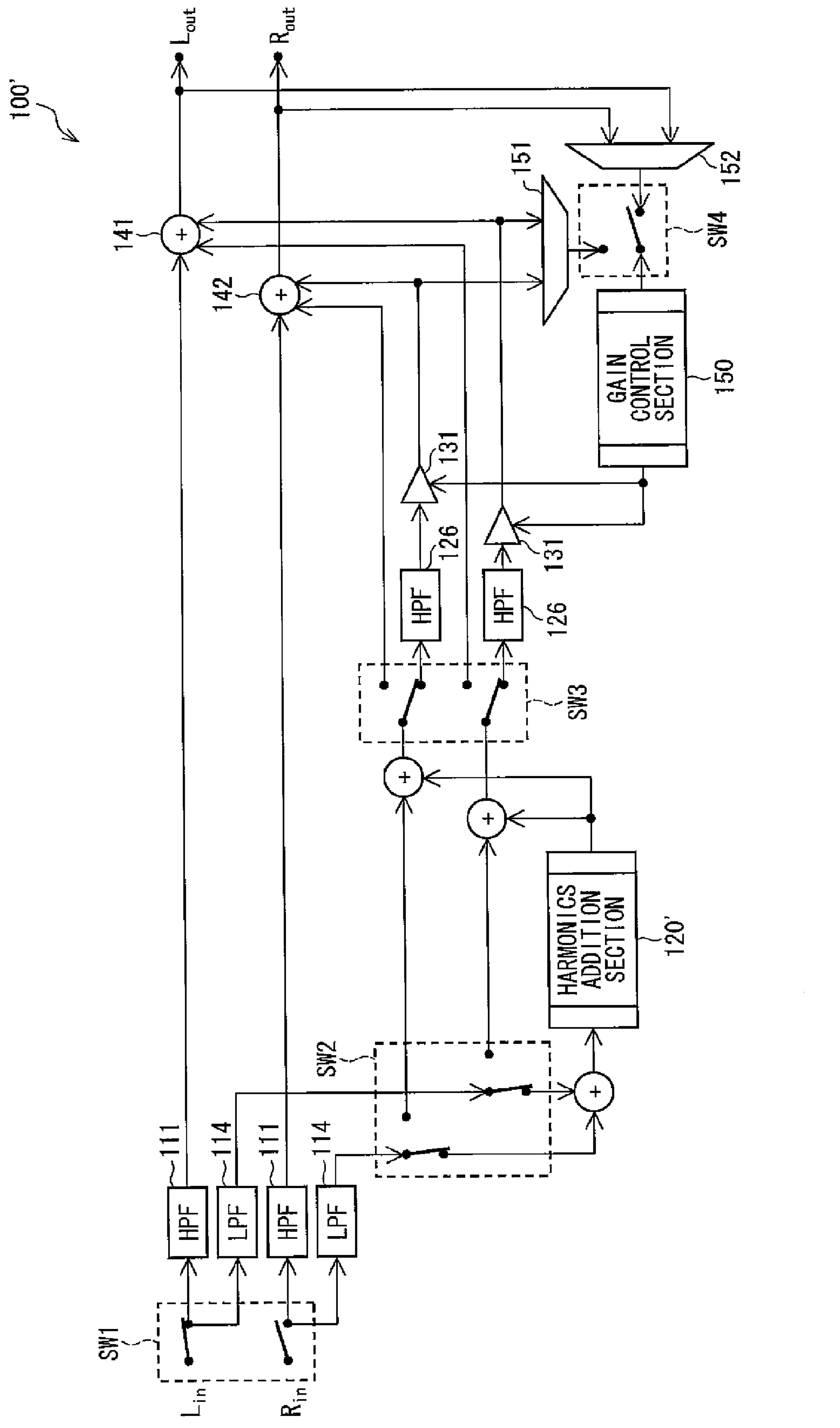
FIG. 28, showing another embodiment of the present invention, is a block diagram illustrating an arrangement of a sound signal processing device.
Figure 29:
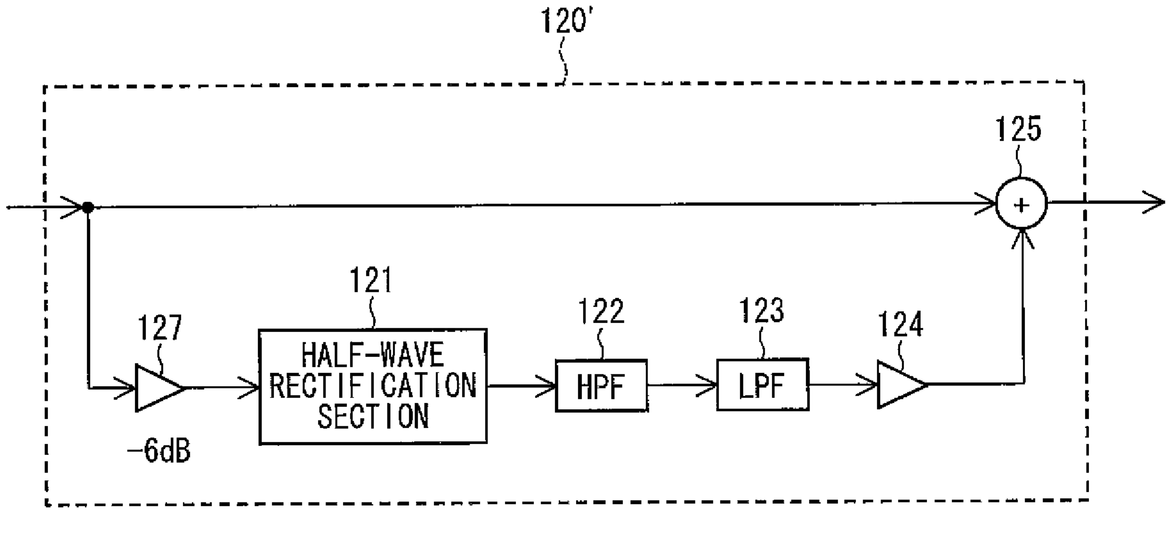
FIG. 29, showing another embodiment of the present invention, is a block diagram illustrating an arrangement of a harmonics addition section provided on the sound signal processing device.
Figure 30:
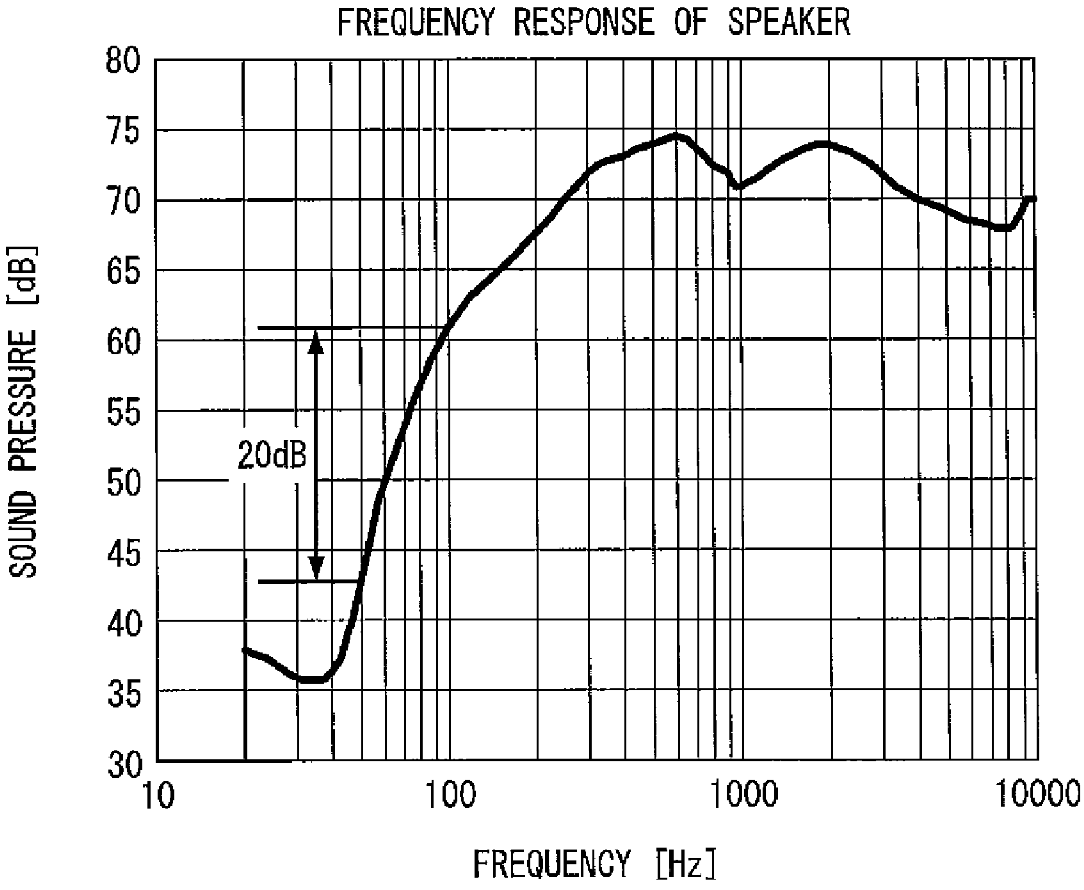
FIG. 30 is a graph illustrating a frequency characteristic of a small speaker which can be installed on a television.

The following description will explain a sound signal processing device 100' according to another embodiment of the present invention with reference to FIG. 28 and FIG. 29.

FIG. 28 is a block diagram illustrating an arrangement of the sound signal processing device 100'. Further, FIG. 29 is a block diagram illustrating an internal arrangement of a harmonics addition section 120' provided on the sound signal processing device 100'.

The sound signal processing device 100' is arranged basically by combining the respective blocks of the sound signal processing device 100 which are shown in FIG. 1 and FIG. 2. Thus, in FIG. 28 and FIG. 29, the same reference numerals as those of the sound signal processing device 100 are given to blocks having the same functions as those of the sound signal processing device 100, so that descriptions of the blocks are omitted.

As apparent from FIG. 28, the sound signal processing device 100' is different from the sound signal processing device 100 in the following points.

First, the sound signal processing device 100 has a horizontally provided dual system in which the low-pass filter 114, the harmonics addition section 120, the high-pass filter 126, and the gain-variable amplifier 131 are disposed.

The sound signal processing device 100' includes a switch SW1 for switching for allowing or disallowing each sound signal to be inputted.

Further, the sound signal processing device 100' includes a switch SW2 for switching the low frequency signal amplification circuit of the dual system so as to allow a low frequency signal extracted by the low-pass filter 114 to be inputted directly to the low frequency signal amplification circuit or so as to allow the low frequency signal to be inputted to the low frequency signal amplification circuit via the harmonics addition section 120'.

In case of allowing the low frequency signal extracted by the low-pass filter 114 to be inputted directly to the low frequency signal amplification circuit, the sound signal processing device 100' carries out a normal low frequency enhancement process for simply amplifying only a low frequency signal having passed through the low-pass filter 114. While, in case of allowing the low frequency signal extracted by the low-pass filter 114 to be inputted to the low frequency signal amplification circuit via the harmonics addition section 120', there is carried out a low frequency enhancement process similar to that of the sound signal processing device 100 which enhances the bass with harmonics.

Further, the sound signal processing device 100' includes a switch SW3 for allowing a low frequency signal extracted by the low-pass filter 114 or a low frequency signal obtained by adding harmonics to that low frequency signal to be directly synthesized with a middle or high frequency signal or for allowing a signal obtained by attenuating an unnecessary low frequency component with the high-pass filter 126 and amplifying the resultant signal with the amplifier 131 to be synthesized with a middle or high frequency signal.

Further, the sound signal processing device 100' includes a switch SW4 for selecting (i) a signal based on the output signals from the output sections Lout and Rout or (ii) the low frequency signal having been amplified by the amplifier 131, as a sound signal referred to by the gain control section 150 in controlling the gain of the amplifier 131.

Note that, in the sound signal processing device 100', first, the output signals outputted from the output sections Lout and Rout are inputted to an output level determining section 152. The output signal level determining section 152 calculates an absolute value of a left-channel output signal outputted from the output section Lout and an absolute value of a right-channel output signal outputted from the output section Rout and inputs larger one of the calculated two absolute values into the switch SW4.

Further, the low frequency signals outputted from the two amplifiers 131 for respectively amplifying the left-channel low frequency signal and the right-channel low frequency signal are inputted to a low frequency signal level determining section 151. The low frequency signal level determining section 151 calculates an absolute value of the left-channel low frequency signal and an absolute value of the right-channel low frequency signal and inputs larger one of the calculated two absolute values into the switch SW4.

As a result, the gain control section 150 can control the gain of the amplifier 131 in accordance with (i) an output level based on the output signals respectively outputted from the output sections Lout and Rout or (ii) a low frequency level of the low frequency signal amplified by the amplifier 131.

Note that, the sound signal processing device 100' can be used also for a purpose other than the enhancement of the bass. That is, the switch SW2 is set so as not to add any harmonics and so as to be able to attenuate the lower limit gain Gmin of the amplifier 131 to −3 dB, so that the sound signal processing device 100' can be used as a protection process device for preventing any clip in case where the amplitude of the low frequency component is amplified to an unexpected level by a signal process at the preceding stage of the input sections Lin and Rin (a down-mix process, a virtual surround process, an equalization process, and the like, each of which changes a 5.1 ch multi-channel signal into a 2 ch signal).

[Additional Remarks]

As described above, the sound signal processing device 100 can be realized by a digital signal processor. That is, the sound signal processing device 100 can be arranged as a digital signal processor including: an operation unit such as a high-speed product-sum operation unit, ALU (arithmetic logical unit), and the like; and a storage device, such as a program memory, which holds a sound signal processing program for causing the operation unit to function as the sound signal separation section 110, the harmonics addition section 120, the low frequency signal amplification section 130, the sound signal synthesis section 140, and the gain control section 150. This is applicable also to the sound signal processing device 100'.

Further, the object of the present invention can be realized not only in such a manner that the sound signal processing program is fixedly held by the program memory of the digital signal processor but also in such a manner that: a program code (an executable program, an intermediate code program, and a source program) of the sound signal processing program is supplied to a general-purpose digital signal processor, and the digital signal processor executes the program code. Alternatively, the object of the present invention can be realized also in such a manner that: a storage medium for storing the program code is supplied to the sound signal processing device 100, and the general-purpose digital signal processor provided on the sound signal processing device 100 reads out and executes the program code stored in the storage medium.

Examples of the storage medium include: tapes such as a magnetic tape and a cassette tape, discs such as a magnetic disc (e.g. a floppy disc or a hard disc) and an optical disc (e.g. CD-ROM/MO/MD/DVD/CD-R), cards such as an IC card (including a memory card) and an optical card, and a semiconductor memory such as a mask ROM, EPROM, EEPROM, and a flash ROM.

Further, it may be so arranged that: the digital signal processor (or the sound signal processing device 100 having the digital signal processor) is made connectable to communication networks, and the program code is supplied via the communication networks. The communication networks are not limited to a specific means. Specific examples of the communication network include Internet, intranet, extranet, LAN, ISDN, VAN, a CATV communication network, a virtual private network, a telephone line network, a mobile communication network, a satellite communication network, and the like. Further, a transmission medium constituting the communication network is not particularly limited. Specifically, it is possible to use a wired line such as a line in compliance with IEEE1394 standard, a USB line, a power line, a cable TV line, a telephone line, an ADSL line, and the like, as the transmission medium. Further, it is possible to use (i) a wireless line utilizing an infrared ray used in IrDA and a remote controller, (ii) a wireless line which is in compliance with Bluetooth standard (registered trademark) or IEEE802.11 wireless standard, and (iii) a wireless line utilizing HDR, a mobile phone network, a satellite line, a ground wave digital network, and the like, as the transmission medium. Note that, the present invention can be realized by a computer data signal (data signal sequence) which is realized by electronic transmission of the program code and which is embedded in a carrier wave.

Further, in the foregoing descriptions, the sound signal processing device 100 processes a digital sound signal, but the present invention is not limited to this. That is, the sound signal processing device 100 may process an analog sound signal.

In this case, the sound signal separation section 110 is arranged so as to include a high-pass filter and a low-pass filter each of which is constituted of a resistor and a capacitor for example. Further, the harmonics addition section 120 may be arranged so as to include (i) a half-wave rectification section constituted of a silicon diode and (ii) a high-pass filter and a low pass filter each of which is constituted of a resistor and a capacitor for example. Further, the low frequency signal amplification section 130 may be constituted of a transistor for example. Further, the gain control section 150 may be constituted of a digital signal processor also in case where the output signal is an analog signal after being inputted to the gain control section 150 via the A/D converter. This is applicable also to the sound signal processing device 100'.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a sound signal processing device according to the present invention comprising: sound signal separation means for separating a low frequency signal from a sound signal; low frequency signal amplification/attenuation means, being gain-variable, for either amplifying or attenuating the low frequency signal having been separated; low frequency signal amplification/attenuation means, being gain-variable, for either amplifying or attenuating the low frequency signal having been separated; sound signal synthesis means for synthesizing the low frequency signal, having been amplified or attenuated, with at least part of the sound signal so as to obtain an output signal; and gain control means for controlling a gain of the low frequency signal amplification/attenuation means on the basis of the output signal having been obtained.

Further, as described above, a method according to the present invention for processing a sound signal, comprising the steps of: separating a low frequency signal from a sound signal; causing low frequency signal amplification/attenuation means, being gain-variable, to either amplify or attenuate the low frequency signal having been separated; synthesizing the low frequency signal, having been amplified or attenuated, with at least part of the sound signal so as to obtain an output signal; and controlling a gain of the low frequency signal amplification/attenuation means on the basis of the output signal.

Thus, it is possible to obtain an output signal having sufficient bass in being outputted from the speaker without any clipping in the receiving end device and without unstable sound volume at middle and high frequency bands in being outputted from the speaker.

It is preferable to arrange the sound signal processing device according to the present invention so as to further comprise harmonics addition means for adding harmonics containing a fundamental wave to the low frequency signal which has been separated by the sound signal separation means, wherein the low frequency signal amplification/attenuation means amplifies the low frequency signal to which the harmonics have been added by the harmonics addition means.

According to the arrangement, it is possible to obtain an output signal by synthesizing the low frequency signal to which the harmonics have been added with at least part of the sound signal. That is, also in case where the low frequency signal contains a low frequency component equal to or lower than the reproducible lower limit frequency of a speaker, it is possible to obtain an output signal having harmonics which are contained in the low frequency component and whose frequency is higher than the reproducible lower limit frequency of the speaker. Thus, if the speaker is driven on the basis of the resultant output signal, it is possible to cause a listener to feel as if a frequency equal to or lower than the reproducible lower limit frequency of the speaker was reproduced.

Moreover, also in case where an arrangement using a low-pass filter is adopted in order to remove unnecessary high harmonics from the low frequency to which the harmonics have been added, the harmonics having been added to the lower frequency signal contain a fundamental wave, so that it is possible to emphasize the low frequency signal with favorable balance throughout a pass band of the low-pass filter. This is based on the following reason. Also with respect to a low frequency signal whose second or further harmonics are attenuated by the low-pass filter and whose frequency corresponds to a vicinity of an upper limit of the pass band, its fundamental wave (its low frequency component) passes through the low-pass filter without being attenuated.

Note that, it is preferable to arrange the sound signal processing device so that the harmonics addition means includes half-wave rectification means for carrying out half-wave rectification of the low frequency signal having been separated by the sound signal separation means.

According to the arrangement, a fundamental wave and even harmonics can be added to the low frequency signal. Thus, it is possible to obtain an output signal which has sufficient bass in being outputted from the speaker and which is less distorted. This is based on the following reason. The human auditory sense is likely to perceive odd overtones as distortion but hardly perceives even overtones as distortion.

Note that, it is possible to arrange the sound signal processing device so that the harmonics addition means includes: half-wave rectification means for carrying out half-wave rectification of the low frequency signal having been separated by the sound signal separation means; squaring means for squaring a value of the low frequency signal having been subjected to the half-wave rectification.

In this case, the fundamental wave, the second harmonics, and third or further odd harmonics can be added to the low frequency signal.

It is preferable to arrange the sound signal processing device so as to further comprise low frequency component attenuation means for attenuating a low frequency component, out of the low frequency signal to be inputted to the low frequency signal amplification/attenuation means, whose frequency is equal to or less than a predetermined frequency, wherein the low frequency signal amplification/attenuation means amplifies the low frequency signal whose low frequency component has been attenuated by the low frequency component attenuation means.

According to the arrangement, in case where the predetermined frequency is set to the reproducible lower limit frequency of the speaker for example, the low frequency signal whose low frequency component equal to or lower than the reproducible lower limit frequency of the speaker has been attenuated is amplified by the lower frequency signal amplification/attenuation means. As a result, it is possible to avoid such condition that a low frequency component which cannot be reproduced by the speaker increases an output level of the output signal. Thus, the gain of the low frequency signal amplification means can be set higher than that of the arrangement having no low frequency signal amplification/attenuation means, so that it is possible to further realize such effect that the bass can be more emphasized.

The present invention is widely applicable to various kinds of devices for processing a sound signal outputted from a speaker. Particularly, the present invention is favorably applicable to a flat panel display including a small speaker.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A sound signal processing device, comprising:

a sound signal separation unit separating a low frequency signal from a sound signal;

a low frequency signal amplifier/attenuator, being gain-variable, for either amplifying or attenuating the low frequency signal having been separated;

a sound signal synthesizer synthesizing the low frequency signal, having been amplified or attenuated, with at least part of the sound signal so as to obtain an output signal; and a gain controller controlling a gain of the low frequency signal amplifier/attenuator on the basis of the output signal having been obtained.

2. The sound signal processing device as set forth in claim 1, wherein the gain of the low frequency signal amplifier/attenuator can have a negative value in terms of decibel unit.

3. A sound signal processing device, comprising:

a sound signal separation unit separating a low frequency signal from a sound signal;

a low frequency signal amplifier/attenuator, being gain-variable, for either amplifying or attenuating the low frequency signal having been separated;

a sound signal synthesizer synthesizing the low frequency signal, having been amplified or attenuated, with at least part of the sound signal so as to obtain an output signal; and a gain controller controlling a gain of the low frequency signal amplifier/attenuator on the basis of the output signal having been obtained; and a harmonics addition unit configured to add harmonics containing a fundamental wave to the low frequency signal which has been separated by the sound signal separation unit, wherein the low frequency signal amplifier/attenuator amplifies the low frequency signal to which the harmonics have been added by the harmonics addition unit.

4. The sound signal processing device as set forth in claim 3, wherein the harmonics addition unit includes a half-wave rectifier carrying out half-wave rectification of the low frequency signal having been separated by the sound signal separation unit.

5. The sound signal processing device as set forth in claim 3, wherein the harmonics addition unit includes:

a half-wave rectifier carrying out half-wave rectification of the low frequency signal having been separated by the sound signal separation unit; and a squaring unit squaring a value of the low frequency signal having been subjected to the half-wave rectification.

6. The sound signal processing device as set forth in claim 1, further comprising:

a low frequency component attenuator attenuating a low frequency component, out of the low frequency signal to be inputted to the low frequency signal amplifier/attenuator, whose frequency is equal to or less than a predetermined frequency, wherein the low frequency signal amplifier/attenuator amplifies the low frequency signal whose low frequency component has been attenuated by the low frequency component attenuator.

7. The sound signal processing device as set forth in claim 3, wherein the gain of the low frequency signal amplifier/attenuator can have a negative value in terms of decibel unit.

8. The sound signal processing device as set forth in claim 3, further comprising:

a low frequency component attenuator attenuating a low frequency component, out of the low frequency signal to be inputted to the low frequency signal amplifier/attenuator, whose frequency is equal to or less than a predetermined frequency, wherein the low frequency signal amplifier/attenuator amplifies the low frequency signal whose low frequency component has been attenuated by the low frequency component attenuator.

* * * * *